(12) United States Patent
McKendrick

(10) Patent No.: US 9,230,044 B1
(45) Date of Patent: Jan. 5, 2016

(54) CHECKING GAUGE HAVING INTEGRATED FEATURES AND METHOD OF MAKING THE SAME

(71) Applicant: Blair T. McKendrick, Bloomfield Hills, MI (US)

(72) Inventor: Blair T. McKendrick, Bloomfield Hills, MI (US)

( * ) Notice: Subject to any disclaimer, the term of this patent is extended or adjusted under 35 U.S.C. 154(b) by 287 days.

(21) Appl. No.: 13/672,672

(22) Filed: Nov. 8, 2012

(51) Int. Cl.
*G01B 5/20* (2006.01)
*G06F 17/50* (2006.01)
*G01B 3/46* (2006.01)

(52) U.S. Cl.
CPC *G06F 17/50* (2013.01); *G01B 3/46* (2013.01); *G01B 5/20* (2013.01)

(58) Field of Classification Search
CPC ..................................... G01B 5/20; G01B 3/14
USPC ..................................... 33/551–553, 545, 549
See application file for complete search history.

(56) References Cited

U.S. PATENT DOCUMENTS

| | | | | |
|---|---|---|---|---|
| 3,203,100 A * | 8/1965 | Hegedus | | 33/534 |
| 4,232,068 A * | 11/1980 | Hoh et al. | | 428/43 |
| 4,593,476 A * | 6/1986 | Clark et al. | | 33/529 |
| 5,208,995 A | 5/1993 | McKendrick | | |
| 5,400,517 A | 3/1995 | McKendrick | | |
| 5,412,877 A | 5/1995 | McKendrick | | |
| 5,624,724 A * | 4/1997 | Relly | | 428/43 |
| 6,029,333 A | 2/2000 | Sapienza | | |
| 6,145,212 A | 11/2000 | Geise et al. | | |
| 6,571,484 B2 * | 6/2003 | Hastilow | | 33/546 |
| 7,103,985 B1 * | 9/2006 | Phillips et al. | | 33/562 |
| 7,243,438 B2 | 7/2007 | Jaubert | | |
| 7,310,916 B2 * | 12/2007 | Gorman | | 52/126.1 |
| 7,676,944 B2 | 3/2010 | Kato | | |
| 2001/0023543 A1 * | 9/2001 | Hastilow | | 33/546 |
| 2005/0120648 A1 * | 6/2005 | Gorman | | 52/204.5 |
| 2014/0157610 A1 * | 6/2014 | Garvey et al. | | 33/503 |

* cited by examiner

*Primary Examiner* — Yaritza Guadalupe-McCall

(57) ABSTRACT

A gauge for checking the tolerance of a manufactured tube having at least one bend therein is digitally manufactured layer-by-layer using an additive manufacturing machine. Multiple features of the gauge are integrated with each other within a common reference coordinate system to precisely locate the features relative to each other.

10 Claims, 44 Drawing Sheets

CHECKING GAUGE HAVING INTEGRATED FEATURES AND METHOD OF MAKING THE SAME

CROSS REFERENCE TO RELATED APPLICATIONS

This application claims the benefit of Provisional U.S. patent Application No. 61/628,927 filed Nov. 9, 2011, which is incorporated by reference herein.

BACKGROUND INFORMATION

1. Field

This disclosure generally relates to gauges and checking fixtures, and deals more particularly with a method of automatic fabrication of a gauge having integrated features and components, and a gauge fabricated by the method.

2. Background

Fixture type gauges may be used to determine the conformance of mass-produced parts with one or more reference standards. For example, metal or plastic tubes used as fuel, hydraulic or pneumatic lines on vehicles may include a number of bends and turns that must be manufactured within certain tolerances in order to assure that the tubes can achieve proper fitment on the vehicle. Fixture gauges, sometimes referred to as checking fixtures, may be used to check whether a tube has been manufactured to within the required tolerances.

In the past, fixture gauges of the type mentioned above were manufactured from wood, or similar solid material, in which one or more gauge blocks were individually fabricated and mounted on a gauge base. The gauge blocks included features that allowed a worker to place a tube on the gauge blocks and visually determine whether various features of the tube had been manufactured within the required tolerance. Early types of fixture gauges were made by skilled toolmakers with woodworking skills. More recently, the process of fabricating wooden fixture gauges has been partially automated using computer-controlled equipment to cut out components of the gauge and mark them with alignment marks that aid in assembling the components with the required accuracy. This partially automated process for fabricating fixture gauges is nevertheless more time consuming than desired, and relies on skilled workers to properly align and assemble the components of the gauge. Additionally, reliance on workers to assemble a gauge introduces the possibility human error which may affect accuracy of the gauge Accordingly, there is a need for a method of making a checking gauge having features that are integrated within a common reference coordinate system that is rapid, repeatable and substantially eliminates human error in the fabrication and assembly process. There is also a need for a checking gauge having multiple features that are precisely located relative to each other using automated manufacturing techniques.

SUMMARY

The disclosed embodiments provide a method of fabricating a gauge that may be used to check features of a tube or the like having one or more curves or contours, against one or more reference standards. For example, the gauge may be used to determine whether the tube has been manufactured to within certain acceptable levels of tolerance. The disclosed gauge assures that features and surfaces are precisely located within a common reference coordinate system, and may eliminate manufacturing and errors that can lead to measurement and checking inaccuracies or errors. The method of manufacturing the gauge reduces assembly time, labor and material. Tolerance stack up is substantially eliminated which usually accompanies assembly of multiple gauge components piece-by-piece. In contrast, all of the features of the disclosed gauge are manufactured substantially at the same time. The gauge may be fabricated by digital manufacturing techniques which minimize or eliminate reliance on skilled labor. The gauge may be manufactured from durable, wear resistant materials using automated fabrication equipment controlled by one or more processors based on digital models, such as CAD files defining the tube. Certain features may be incorporated into the gauge that not possible using conventional material removal techniques commonly used in machine processes. Multiple copies of a gauge may be manufactured that are precise and identical. Measurement tolerances may be altered after the gauge is manufactured using snap in, removable shims The gauge may be used to measure or check features of a manufactured product such as a tube having one or more curves, bends and/or contours, with tolerances within which the tube must be manufactured. The gauge broadly comprises a base and one or more gauge blocks on the base. Each of the gauge blocks includes a tube channel for receiving the tube therein, and may include markings which indicate whether the tube is within tolerance at particular locations along its length. Using additive, digital manufacturing techniques, various position sensitive and tolerance critical features of the gauge are automatically co-located and physically integrated within a common reference system. 3-D STL files are employed to control the operation of an additive manufacturing machine, such as an FDM (fused deposition modeling) machine that is used to produce the gauge layer-by-layer.

The method broadly comprises the following steps. First, a 3-D CAD model of the tube is generated from XYZ data, or using a provided 3-D CAD model. Then, using the contour tolerance values for the tube envelope, offset surfaces are created of the tube boundary along the profile of the tube. This may be accomplished either manually by selecting the surfaces of the tube model and offsetting them, or by means of an automated program that is capable of generating the offset math data. The offset surface boundary is then split along its centerline at the tangent of the diameter with the boundary walls including tolerance and projected up from the intersection of the diameter when projected perpendicular to the plan view of the intended position of that in which the gauge will be manufactured. The top side boundary walls that are created terminate at the top of the contour tolerance above the tube model with the end result forming a U-shaped profile along the tube model path. The outside surfaces of the tube channel blocks are then created around the tube boundary tolerance U-shaped profile to produce the design of the outer shape of the block surfaces. The resulting design is generally transformed from surface features into one or more solid mathematical features. Additional components of the gauge may then be generated, such as a gauge base, mounting holes or other items that may be required to locate features such as, but not limited to and pins, clips, connectors, flange blocks, etc. Once the overall design of the U-shaped boundary tube channel blocks and other components have been completed, the 3-D design can then be output as an STL (stereolithography) file for further processing. In some embodiments, a separate, conventionally constructed base may be employed, and the gauge blocks fabricated by additive manufacturing may be aligned with desired footprints, and mounted on the base.

The disclosed method of producing the gauge has virtually no design constraints and is not limited to designing gauges in a manner that require machining or other conventional fabrication techniques. The gauge may have square corners, undercut design, features inside of other features that are enclosed and other features that may not be fabricated using conventional machining techniques. The method reduces material waste since only the material needed to fabricate the gauge is required. Hollow or semi-hollow gauges may be produced using the disclosed method. Various features of the gauge may be integrated into one complete part that can be produced together. Features such as pin mounting blocks or location features that would otherwise need to be manufactured separately and then mounted on the gauge, may be produced and incorporated into the gauge as a unified structure. Locations of tangents of bends or curves at the termination of each straight section of the tube can be integrated into the design of the U-shaped tube boundary channel blocks, allowing for a defined measurement reference location. The disclosed method allows the U-shaped tube boundary channel blocks to be manufactured in separate sections, and then mounted on a separate support base, aligned along a footprint of the gauge blocks.

According to one disclosed embodiment, a method is provided of making a gauge for checking a tolerance of a manufactured tube having at least one bend therein. The method comprises using an additive manufacturing machine to form at least a first gauge block layer-by-layer, wherein the gauge block has features that are integrated within a common reference coordinate system, and using a computer numerically controlled system to control the operation of the additive manufacturing machine based on a 3-D digital model of the gauge. The method may further comprise using the additive manufacturing machine to form a base and integrate the base into the first gauge block. The method may also comprise using the additive manufacturing machine to form a second gauge block layer-by-layer that is integrated into the base and the first gauge block. The first and second gauge blocks are formed in aligned, spaced apart relationship to each other on the base. Forming the gauge block includes forming a radiused tube channel having a predefined tolerance boundary. Forming the gauge block may also include forming a visible tolerance marker on the gauge block to indicate whether an end of a tube is within a length tolerance. Further, forming the gauge block may include forming a radiused tube channel adapted to receive a tube therein and having sidewalls configured to provide tolerance boundaries, and forming cutouts in the sidewalls of the tube channel which allow a tube in the tube channel to be grasped.

According to another disclosed embodiment, a method is provided of making a gauge used to check features of a bent tube. The method comprises obtaining a digital file representing a 3-D model of the tube and using a computer to generate a mathematical model of a gauge based on the 3-D model of the tube. The method also includes building at least one gauge block layer-by-layer, including forming a tube channel adapted to receive the tube therein and having a tolerance boundary allowing the tolerance of the tube to be checked. Building the gauge block is performed using additive manufacturing. The additive manufacturing may be performed using a fused deposition modeling machine. Generating the mathematical model of the gauge includes modeling multiple gauge features that are integrated within a common reference coordinate system. Generating a mathematical of the gauge includes generating offset surfaces of the boundary of the tube along a profile of the tube. Generating the offset surfaces is performed using contour tolerance values for an envelope of the tube. Generating the mathematical model of the gauge includes selecting surfaces of the 3-D model of the tube and offsetting the selected surfaces using an automated program to generate offset math data representing offsets.

According to still another embodiment, a gauge is provided for checking conformance of a bent tube against a reference standard. The gauge comprises a base, and at least a first gauge block integrally formed with the base and having an integral tube channel in which a bent tube may be placed for checking the tolerance of the tube. The tube channel has a tolerance boundary. The gauge may further comprise a second gauge block integrally formed with the base and spaced apart from the first gauge block, the second gauge block including an integral tube channel in which the bent tube may be placed for checking the tolerance of the tube, the tube channel in the second gauge block being aligned with the tube channel in the first gauge block. The gauge block may include a visible tolerance marker integrally formed with the gauge block for indicating whether the length of the tube is within a tolerance value.

According to still another embodiment, a shim is provided for changing the tolerance boundaries of a U-shaped tube channel in a gauge used to checking the tolerance of a bent tube. The shim comprises a flexible, generally U-shaped member adapted to be removably inserted into the tube channel. The U-shaped member includes at least one rib adapted to engage sidewalls of the tube channel in order to retain the member within the tube channel. The U-shaped member has a thickness corresponding to a preselected amount of desired change in the tube boundary.

BRIEF DESCRIPTION OF THE DRAWINGS

The novel features believed characteristic of the illustrative embodiments are set forth in the appended claims. The illustrative embodiments, however, as well as a preferred mode of use, further objectives and advantages thereof, will best be understood by reference to the following detailed description of an illustrative embodiment of the present disclosure when read in conjunction with the accompanying drawings, wherein:

DETAILED DESCRIPTION

Figure 1:
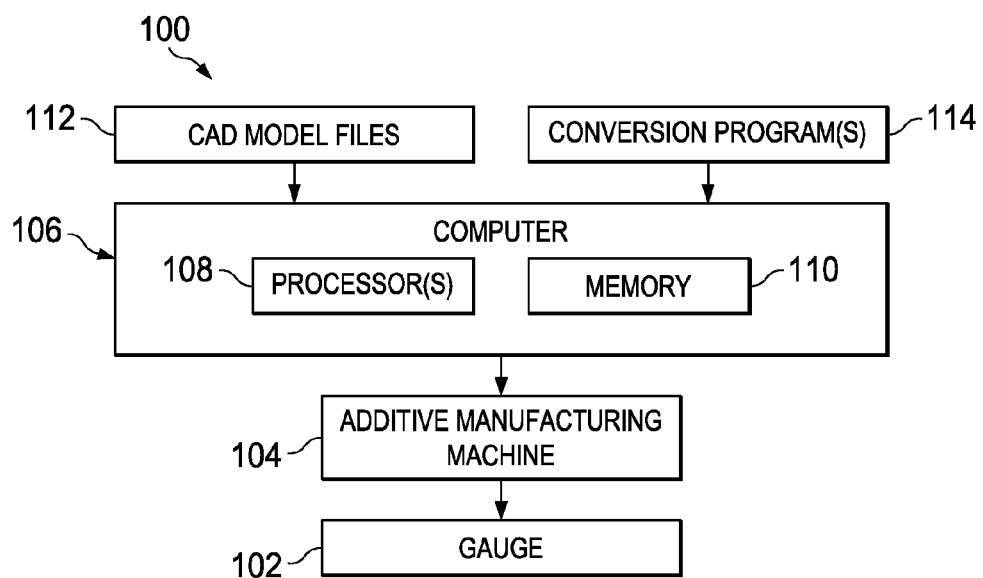
FIG. 1 is an overall block diagram of a system for automatically fabricating a checking gauge according to the disclosed embodiments.

Referring first to FIG. 1, the disclosed embodiments relate to a method of fabricating a gauge 102 which may be employed to check a part (not shown) against a reference standard. For example, the gauge 102 may be employed to check whether a bent tube has been manufactured to within one or more tolerances. As will be discussed below in more detail, the method may include a form of digital manufacturing that allows fabrication of the gauge 102 using additive manufacturing techniques in order to integrate features of the gauge in precise locations within a common reference coordinate system.

The method employs a manufacturing system 100 broadly comprising an additive manufacturing machine 104 controlled by a computer 106. The additive manufacturing machine 104 may comprise a commercially available machine that uses one or more known, additive manufacturing techniques such as, without limitation, fused deposition modeling (FDM), stereolithography (SLA), selective laser sintering (SLS) and three dimensional printing (3DP), to name only a few. Each of these processes may be used to build a three dimensional gauge 102, layer-by-layer, by locally fusing or curing building materials that may be in powder or liquid form. For example, FDM works on an "additive" principle by laying down material in layers. A plastic filament is unwound from a coil and supplies material to an extrusion nozzle which can turn the flow on and off. The nozzle is heated to melt the material and can be moved in both horizontal and vertical directions by a numerically controlled mechanism (not shown), directly controlled by the computer 106. The gauge 102 is produced by extruding small beads of thermoplastic material to form layers as the material hardens immediately after extrusion from the nozzle.

The computer 106 may include one or more processors 108, and memory 110. The computer 106 may have access to one or more CAD (computer aided drawings) model files 112 which are digital representations of parts such as tubes which are to be checked with the gauge 102. As will be discussed below in more detail, the computer 106 may also have access to conversion programs 114 which may include a commercially available software packages employed for data conversion. The computer 106 may retrieve one or more CAD model files 112 defining a part to be checked and may use conversion programs 114 to convert the CAD model files 112 into STL files capable of controlling the additive manufacturing machine 104. The computer 106 is used to create files that digitally define a 3-D model of the gauge 102, including the size and location of critical features, including tolerances, used to check the part. The computer 106 digitally integrates all of the features of the gauge 0102 into a common reference system 121 (FIG. 2) in order to eliminate assembly error and speed the fabrication process.

Figure 2:
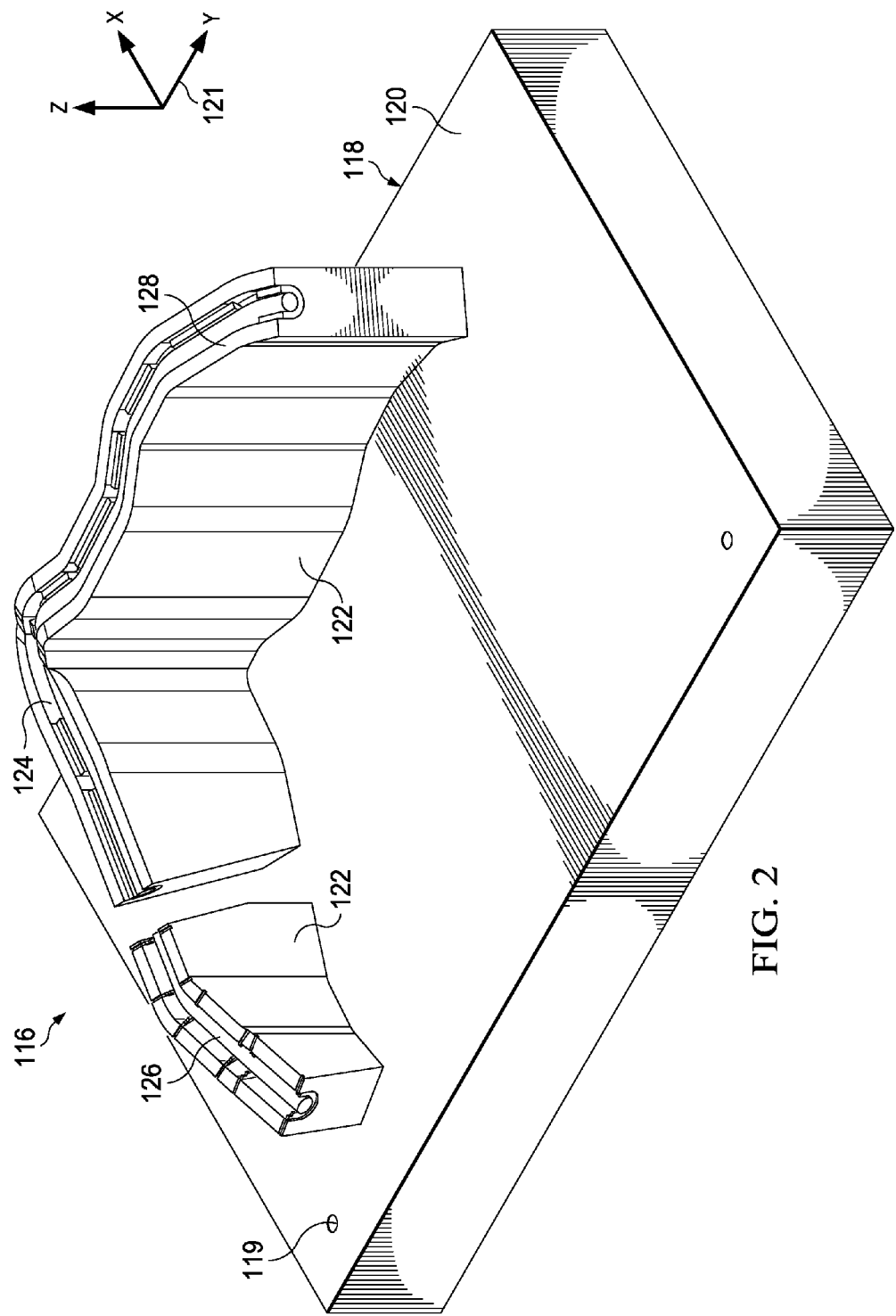
FIG. 2 is a perspective view of the gauge showing gauge blocks with portions a tube shown within tube tolerance channels, other features of the tube not shown.

Attention is now directed to FIG. 2 which illustrates a typical gauge 116 according to the disclosed embodiments, certain features not being shown for clarity. The gauge 116 may include one or more tube channel segment blocks 122, sometimes also referred to here as gauge blocks 122, supported on the surface 120 of a base 118. In the embodiment shown in FIG. 2, the gauge blocks 122 are employed to check features of a bent tube 126 which may be removably placed in a radiused tube channel 124 formed in the top of the gauge blocks 122. The radius of the tube channel 124 will depend upon the radius of the tube being checked and the tolerances that are allowed for the tube 126. The embodiment of the gauge 116 shown in FIG. 2 employs optional shims (discussed later in more detail) in order to adjust the checking tolerance of the gauge 116. The tube channel 24 follows the sweep or curve of the tube 126. The gauge blocks 122 include adjacent, spaced apart upper surfaces 128 which define a plane 123 (FIG. 4) below which all areas of the tube 126 must be located in order for the tube 126 to be within tolerance, as will be explained below in more detail. CMM (coordinate measuring machine) alignment and origin holes 119 may be provided in the base 118 which serve as reference points to establish the three dimensional coordinate system 121 in which all the features of the gauge 116 are located.

Figure 3:
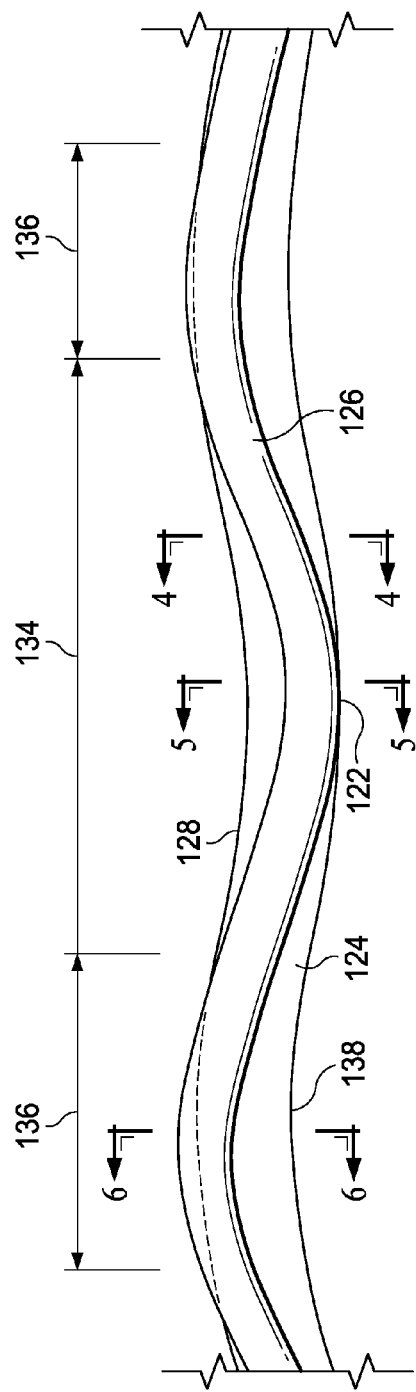
FIG. 3 is a longitudinal sectional view, showing a portion of a tube disposed within the tube tolerance channel.
Figure 6:
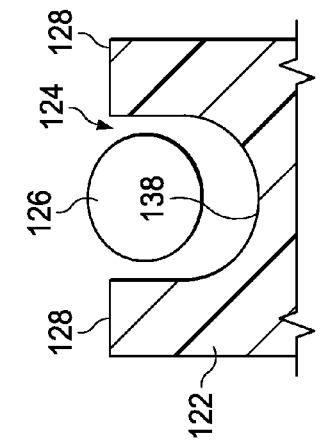
FIG. 6 is a sectional view taken along the line 6-6 in FIG. 3.
Figure 5:
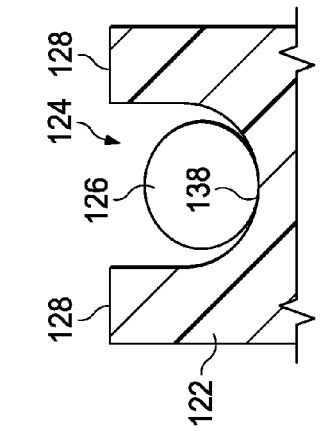
FIG. 5 is a sectional view taken along the line 5-5 in FIG. 3.
Figure 4:
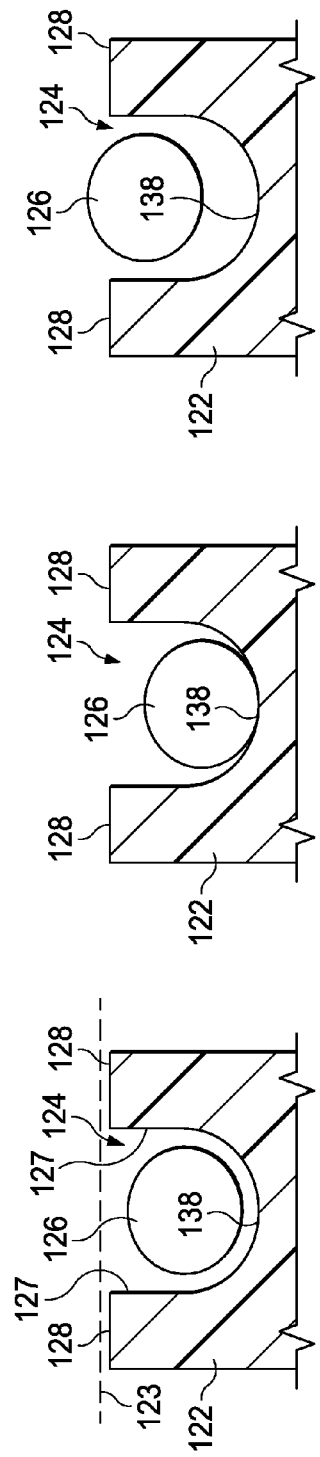
FIG. 4 is a sectional view taken along the line 4-4 in FIG. 3.

Attention is now directed to FIGS. 3-6 which illustrate how the tube channel 124 may be used by an inspector to quickly visually determine whether a particular tube 126 has been manufactured to within preselected tolerances. As previously mentioned, the upper tube channel surfaces 128 form a sweeping plane 123 that corresponds to the upper limit of the tolerance allowed at the top of the tube 126. Thus, along two stretches 136 of the tube 126 in his example, it may be seen that the top of the tube 126 is above the upper surfaces 128 (plane 123) and therefore is "out of tolerance", whereas the top of the tube 126 is below the upper surfaces 128 along a central stretch 134 and is thus within tolerance in this area. As shown in FIG. 4, the sides 124 of the tube channel 124 define it the lateral tolerance boundaries, and the bottom 138 of the tube channel 124 defines the bottom of the tolerance boundary for a tube 126 that has been manufactured to within the allowed tolerances.

Figure 7:
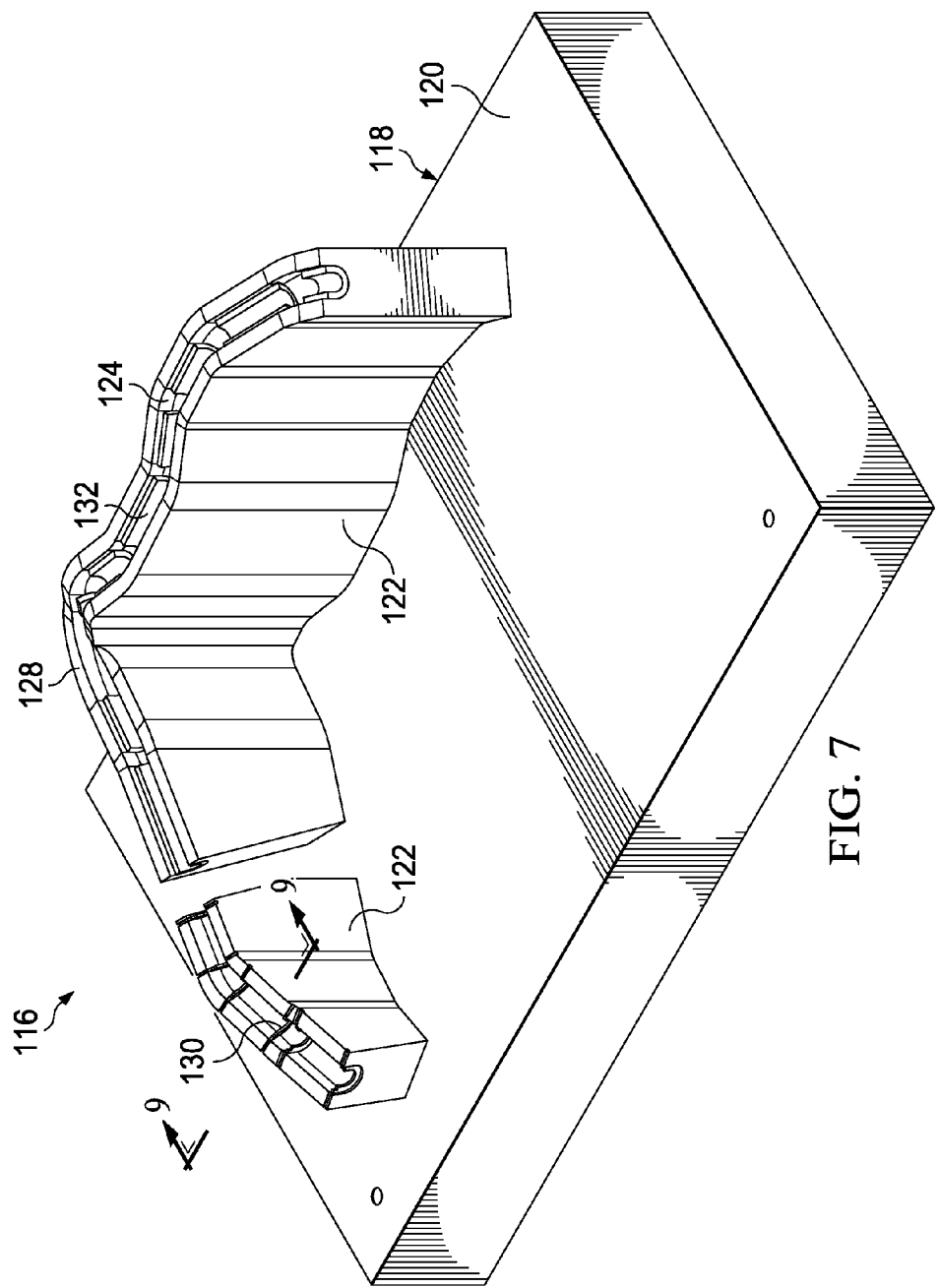
FIG. 7 is a perspective view similar to FIG. 2, with the tube having been removed.
Figure 8:
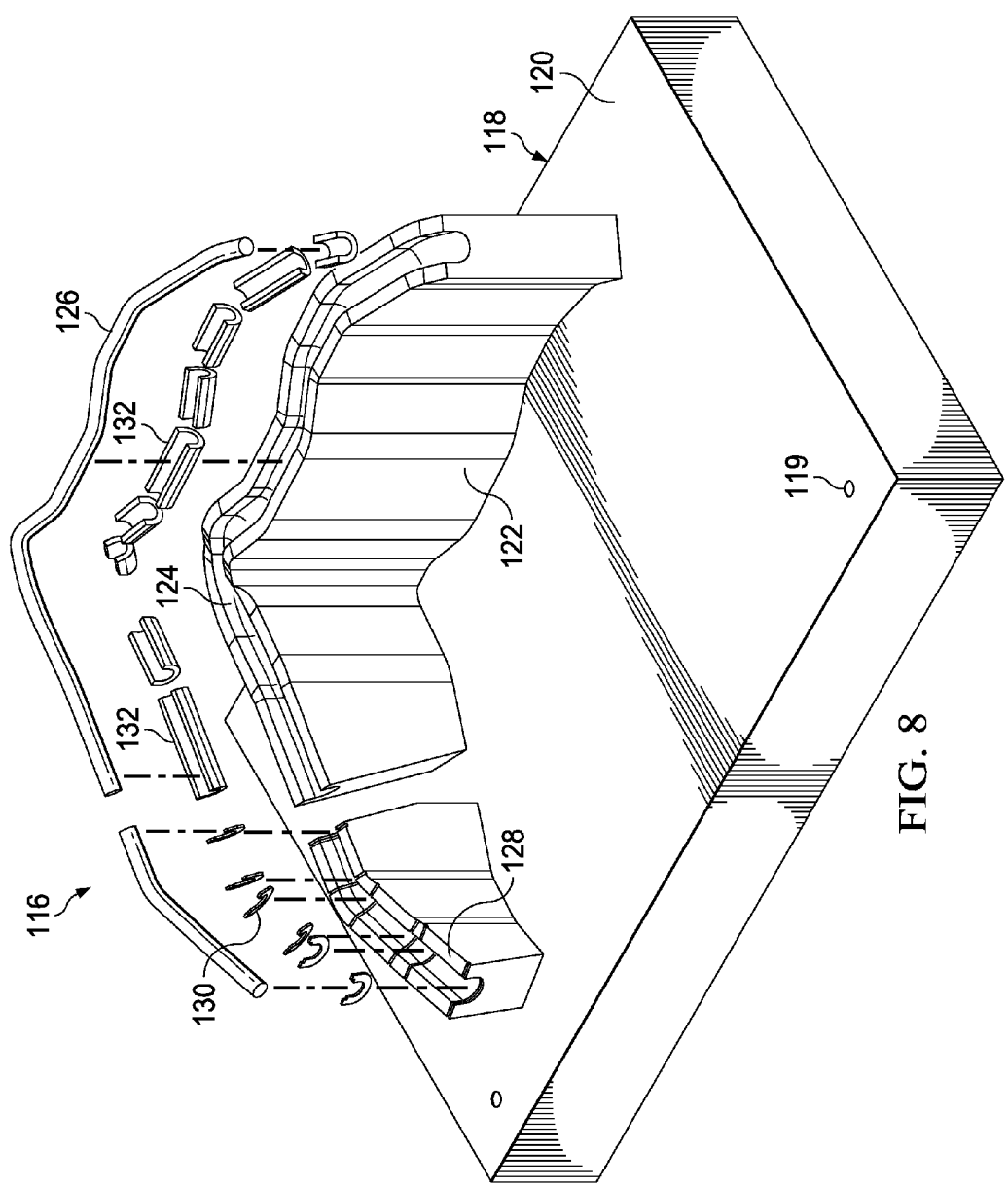
FIG. 8 is a perspective view similar to FIG. 2, but showing the shims in exploded form.

Referring now to FIGS. 7 and 8, in one optional embodiment, shims 130, 132 may be installed into the tube channel 124 in order to alter the tolerance boundaries at one or more locations along the tube channel 124. For example, in some applications, one of the shims 130, 132 may be placed near a bend in the tube 126 where it may be important that the tube 126 be within closer tolerances compared to other areas of the tube 126. In some embodiments, the shims 30 may be of a type that are recessed into the gauge blocks 122, while in other embodiments, shims 132 may be located and held entirely within the tube channel 124 by any suitable means.

Figure 9:
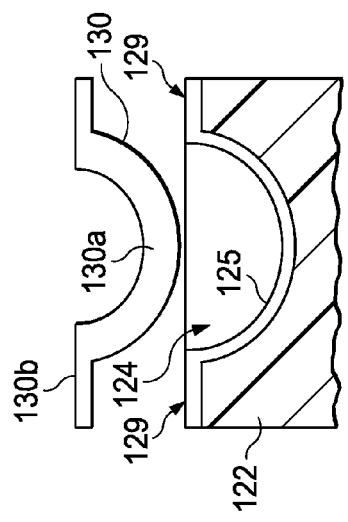
FIG. 9 is a sectional view taken along the line 9-9 in FIG. 7, one of the shims having been removed to a position above the tube tolerance channel in which it is normally installed.
Figure 10:
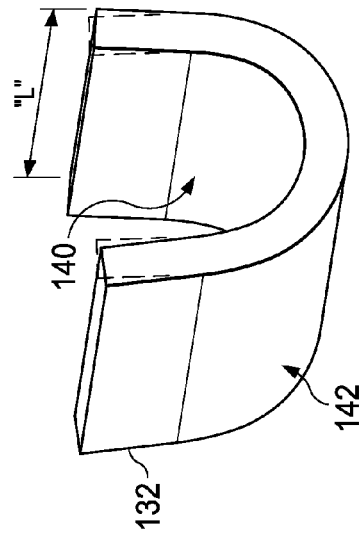
FIG. 10 is a perspective view of an alternate embodiment of a shim, a flexed condition of the shim indicated by broken lines.
Figure 13:
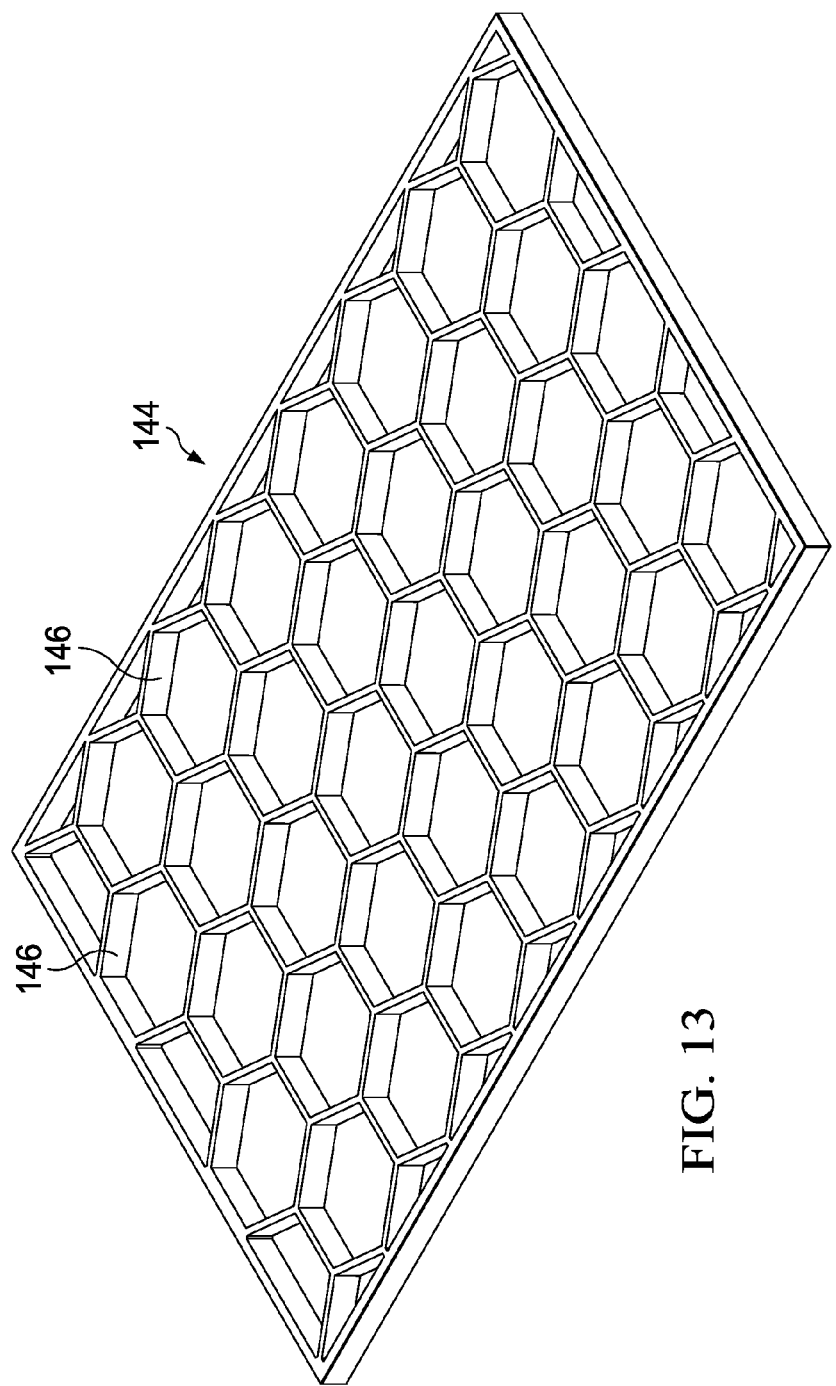
FIG. 13-24 are perspective views showing progressive stages of manufacturing the gauge shown in FIG. 2 using additive manufacturing.
Figure 14:
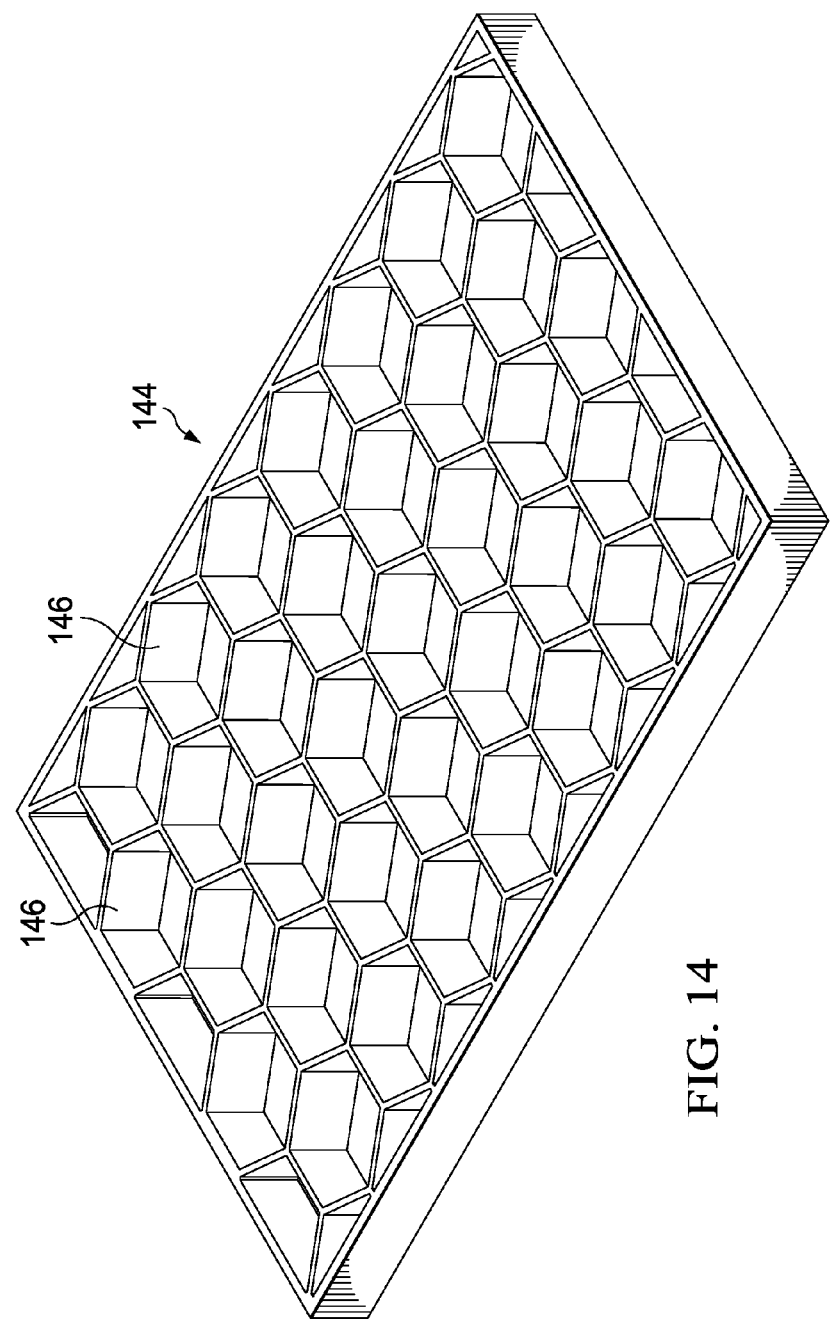
Figure 15:
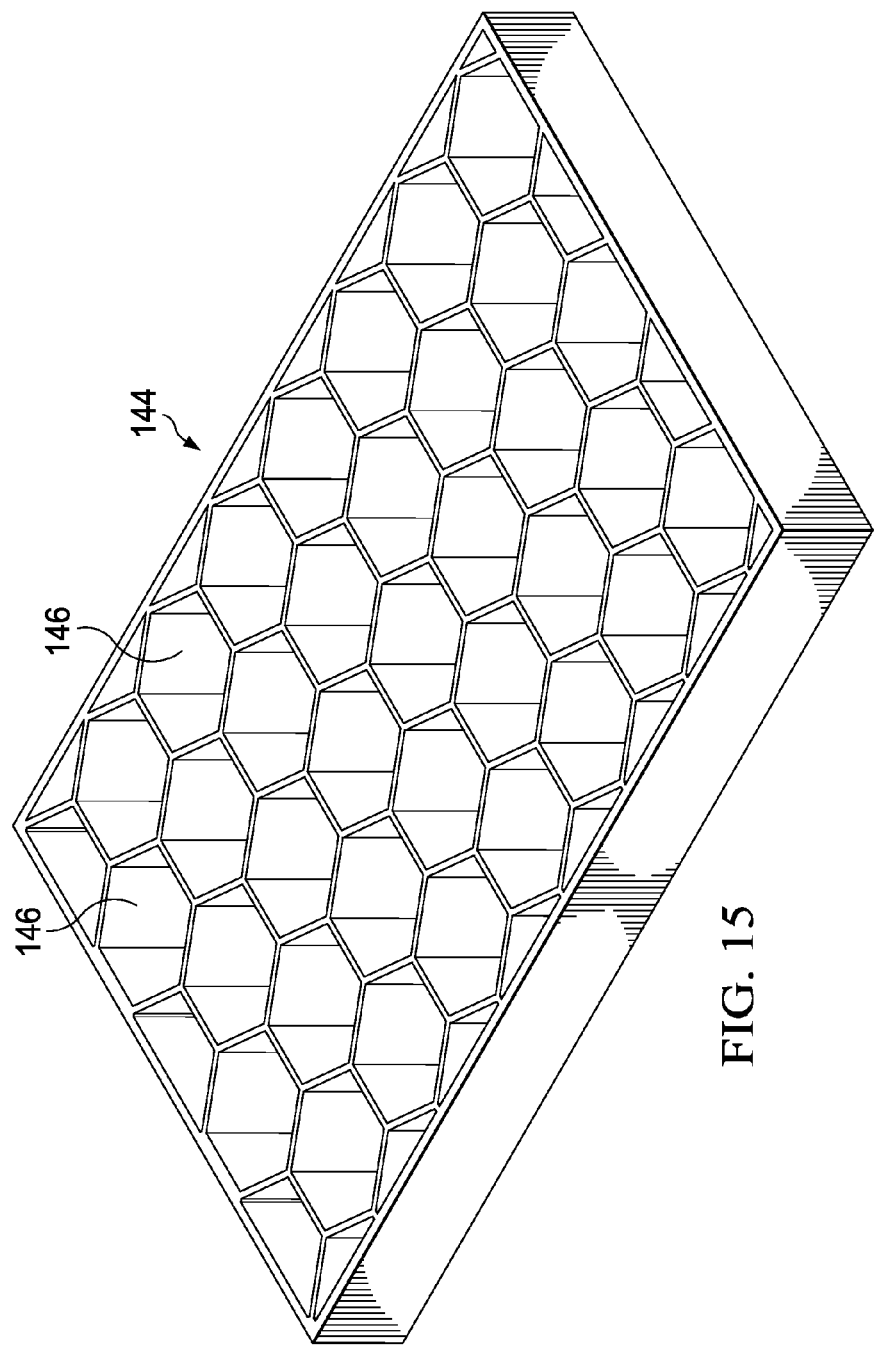

FIG. 9 illustrates one of the recessed type shims 130 having a curved portion 130a and a pair of arms 130b. The gauge block 122 includes a recess 125 having shoulders 129 which respectively receive the curved portion 130a and the arms 130b of the shim 130 in order to retain the shim 130 within the tube channel 124. It may be seen that the thickness of the curved portion 130a of the shim 130 is greater than the thickness of the recess 125, thus changing the tolerance boundary used to gauge the tube 126. Referring to FIG. 10, the shims 132 which rest entirely within the tube channel 124 may be made of a flexible material, such as nylon. The outer surfaces 142 of the shims 132 frictionally engage the sidewalls 127 (FIG. 4) within the tube channels 124 to retain the shims 132. The inside surfaces 140 of the shims 132 are adapted to engage the tube 126 and define the sides and bottom of the tolerance boundaries. The length "L" of the shim 132 will depend upon the application, including the shape and configuration of the tube 126.

Figure 11:
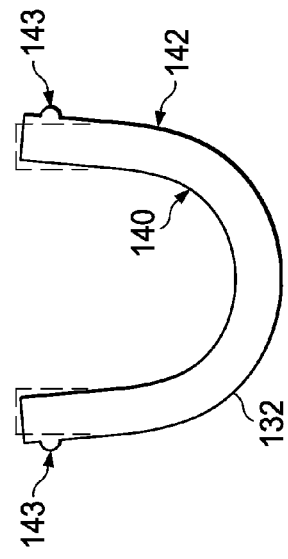
FIG. 11 is an end view of another embodiment of a shim, a flexed condition of the shim indicated by broken lines.
Figure 12:
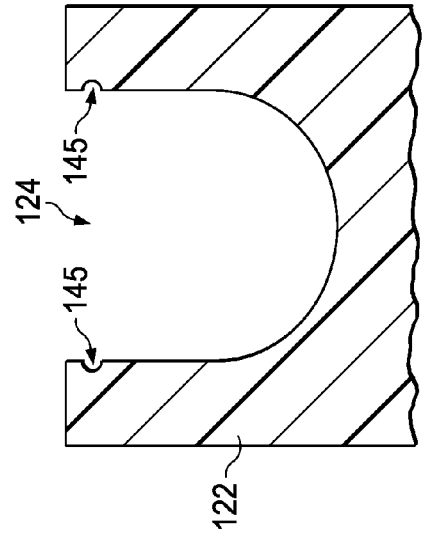
FIG. 12 is a cross-sectional view showing a tube tolerance channel having a groove adapted to receive the shim shown in FIG. 11 in snap fit relationship.

FIGS. 11 and 12 illustrate another technique for retaining the shims 132 within the tube channel 124. In this embodiment, the outer surfaces 142 of the shims 132 may include longitudinally extending nubs or ribs 143 which are received in snap fit relationship within grooves 145 formed in the inner side walls 127 of the tube channel 124.

Referring now to FIGS. 13-24, the gauge 116 is automatically fabricated, digitally, using the additive manufacturing machine 104 (FIG. 1), layer-by-layer using programmed instructions generated by the computer 106 which are based on a CAD file 112 that digitally defines the tube 126. In this example, a pair of gauge blocks 122 are formed integral with a base 118 as the gauge 116 is built layer-by-layer. The base 118 of the gauge 116 is formed by laying down a series of base layers 144 on top of each other, including a series of layers which form the base surface 120. As the base layers 144 are laid down, openings 146, herein shown as hexagonal in shape, may be formed within each of the base layers 144 in order to both speed the fabrication process and reduce material usage.

Figure 16:
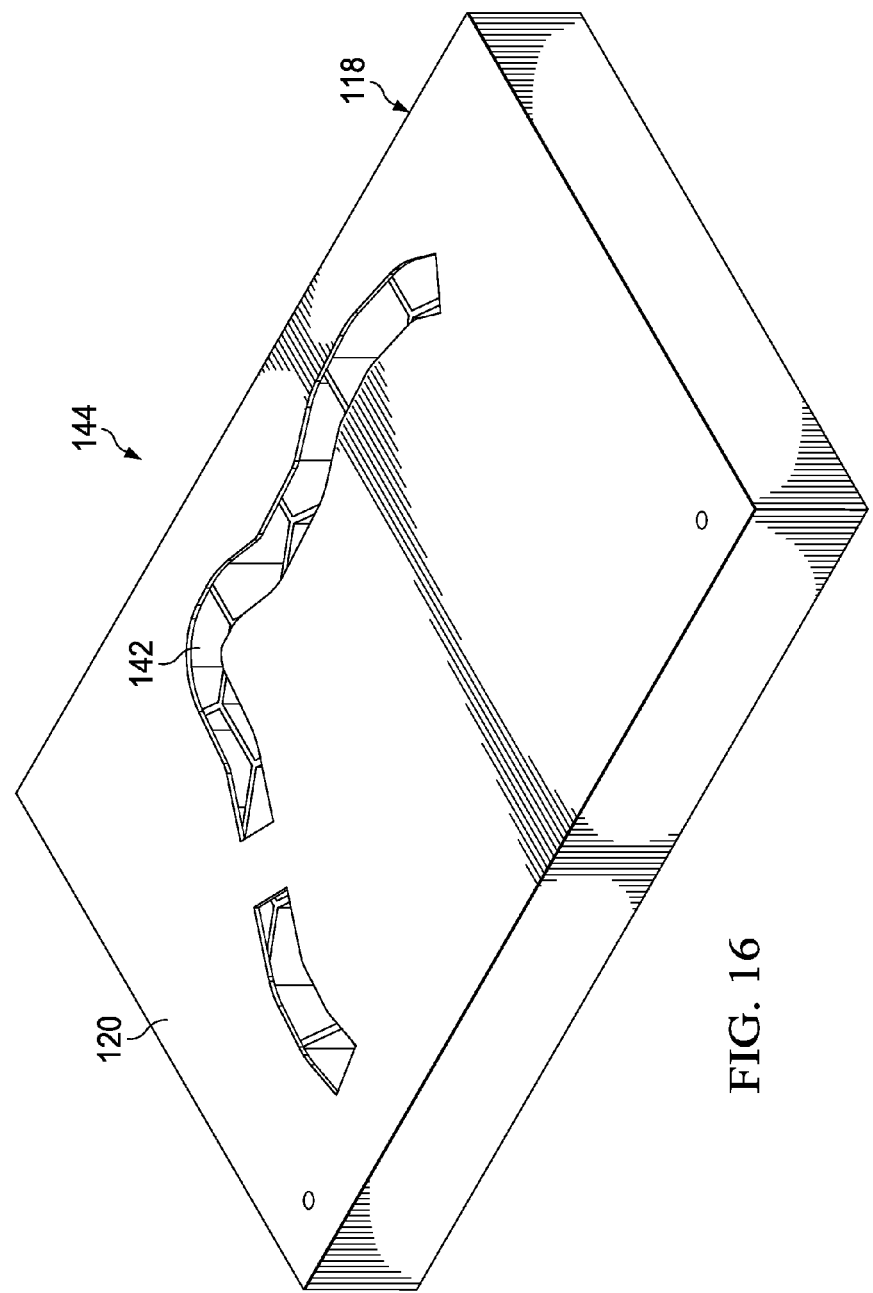
Figure 17:
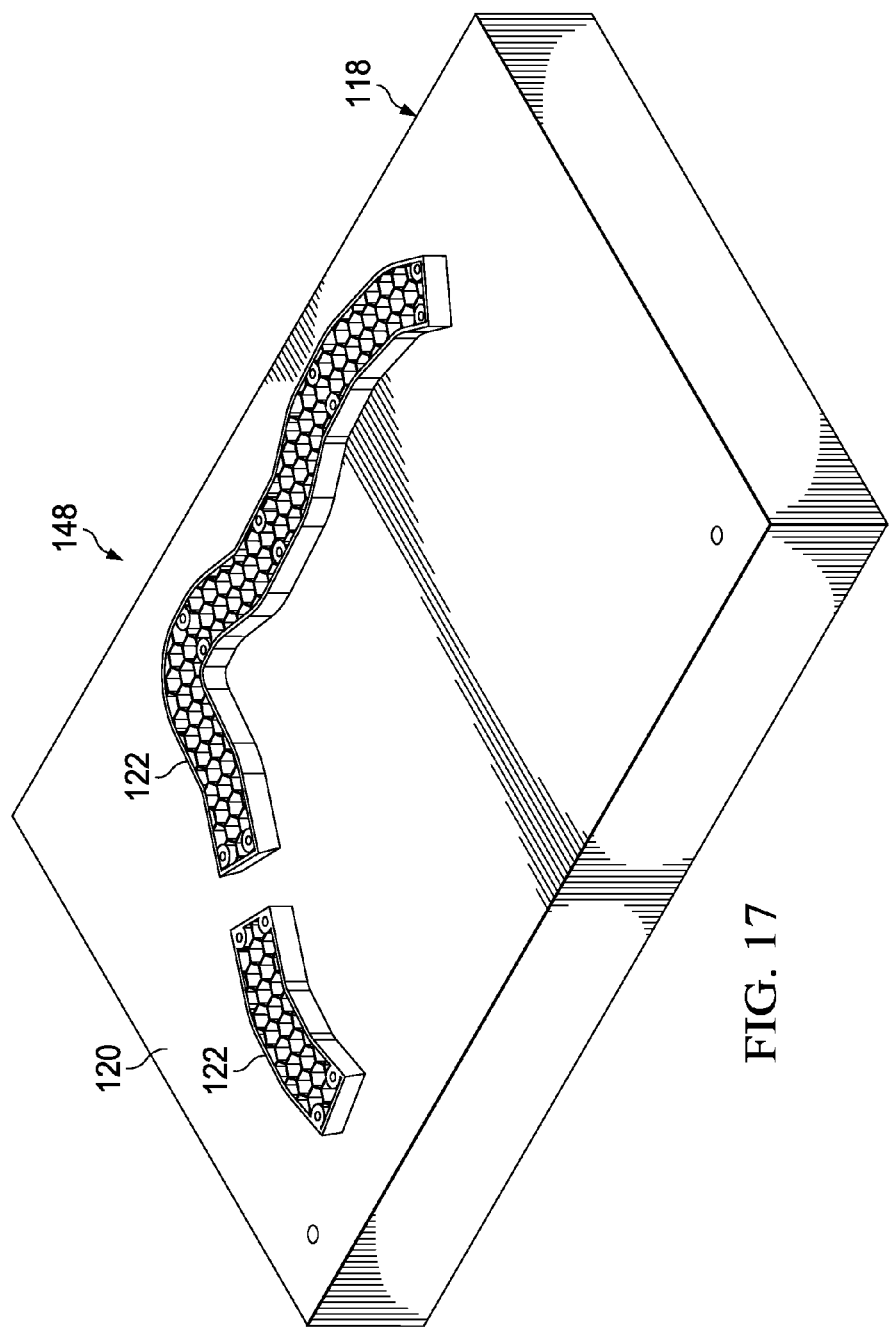
Figure 18:
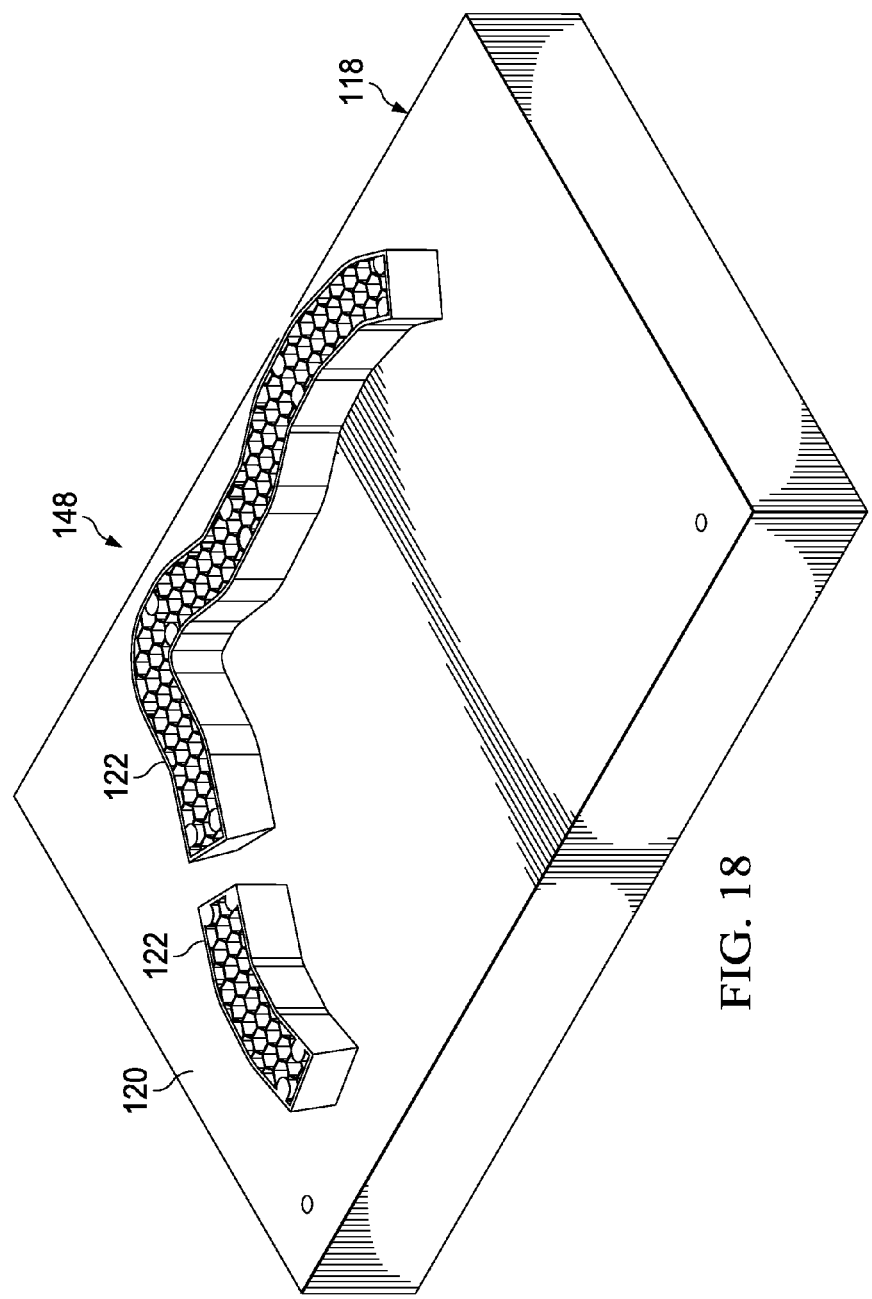
Figure 19:
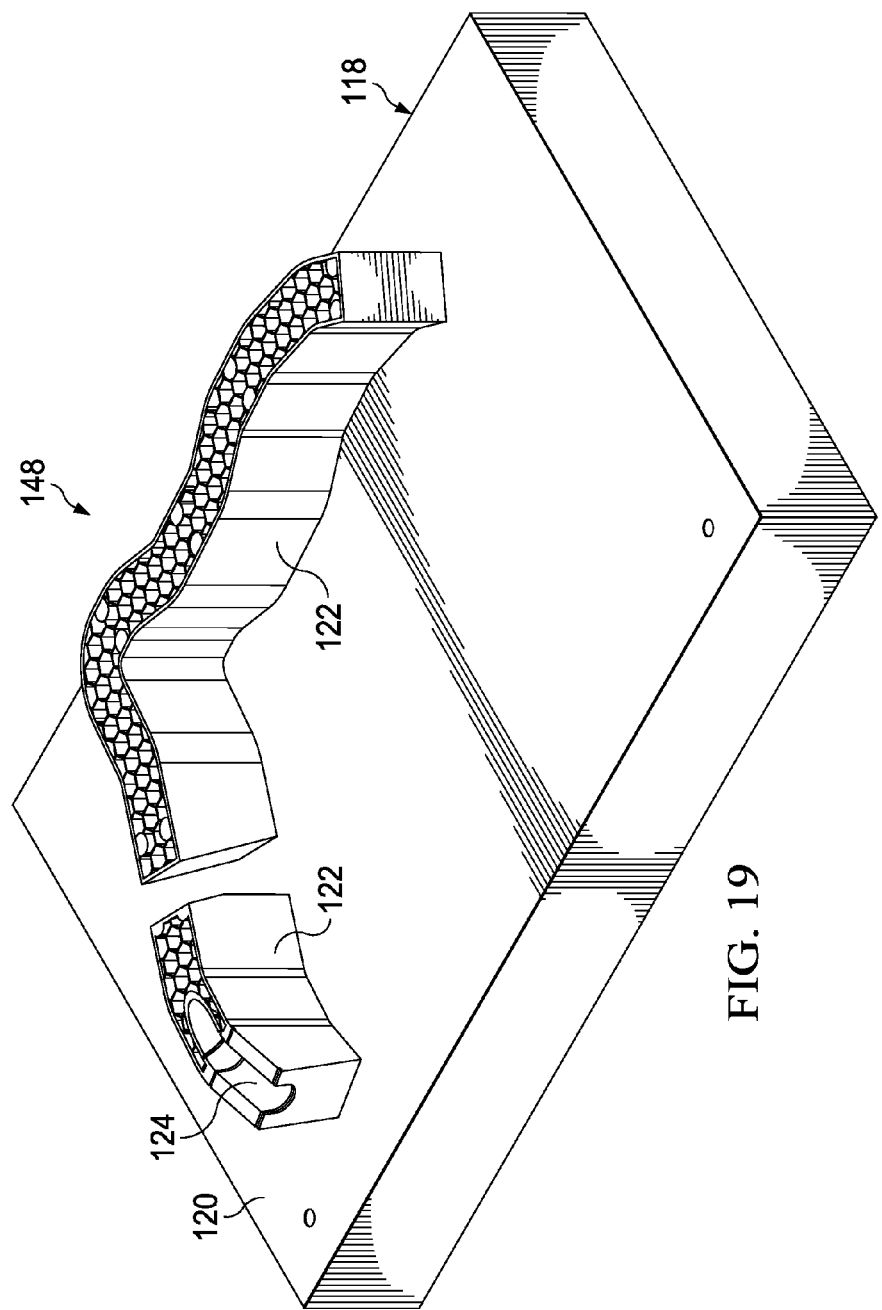
Figure 20:
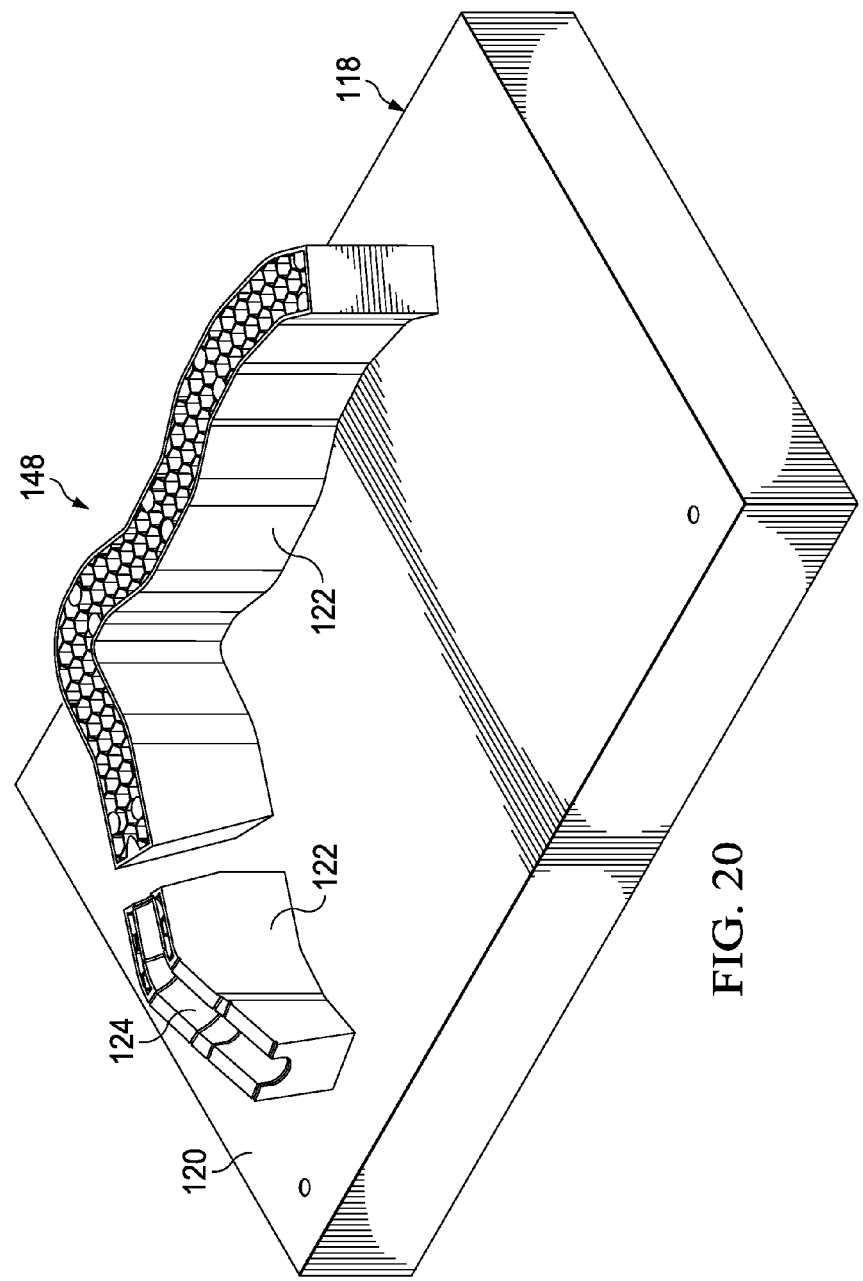
Figure 21:
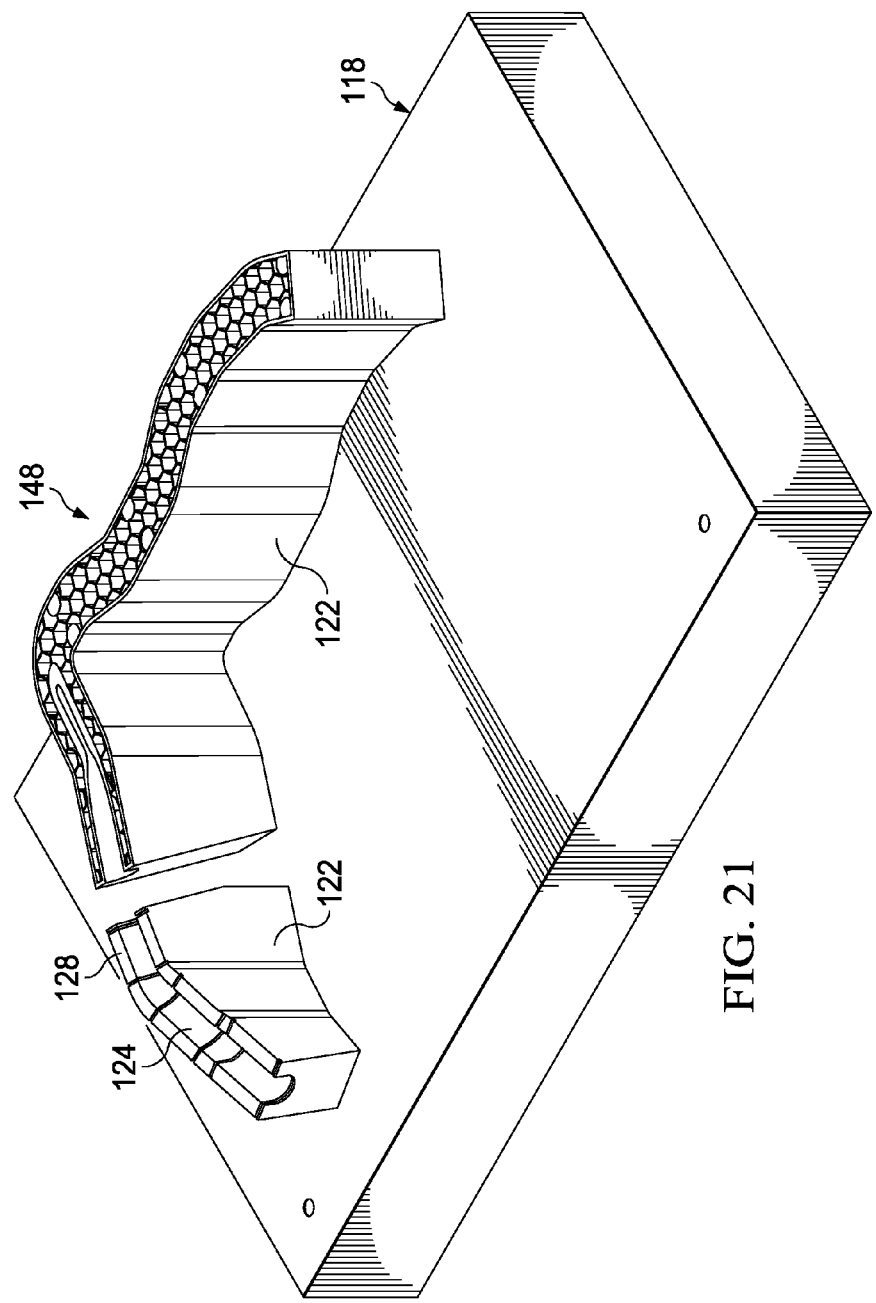
Figure 22:
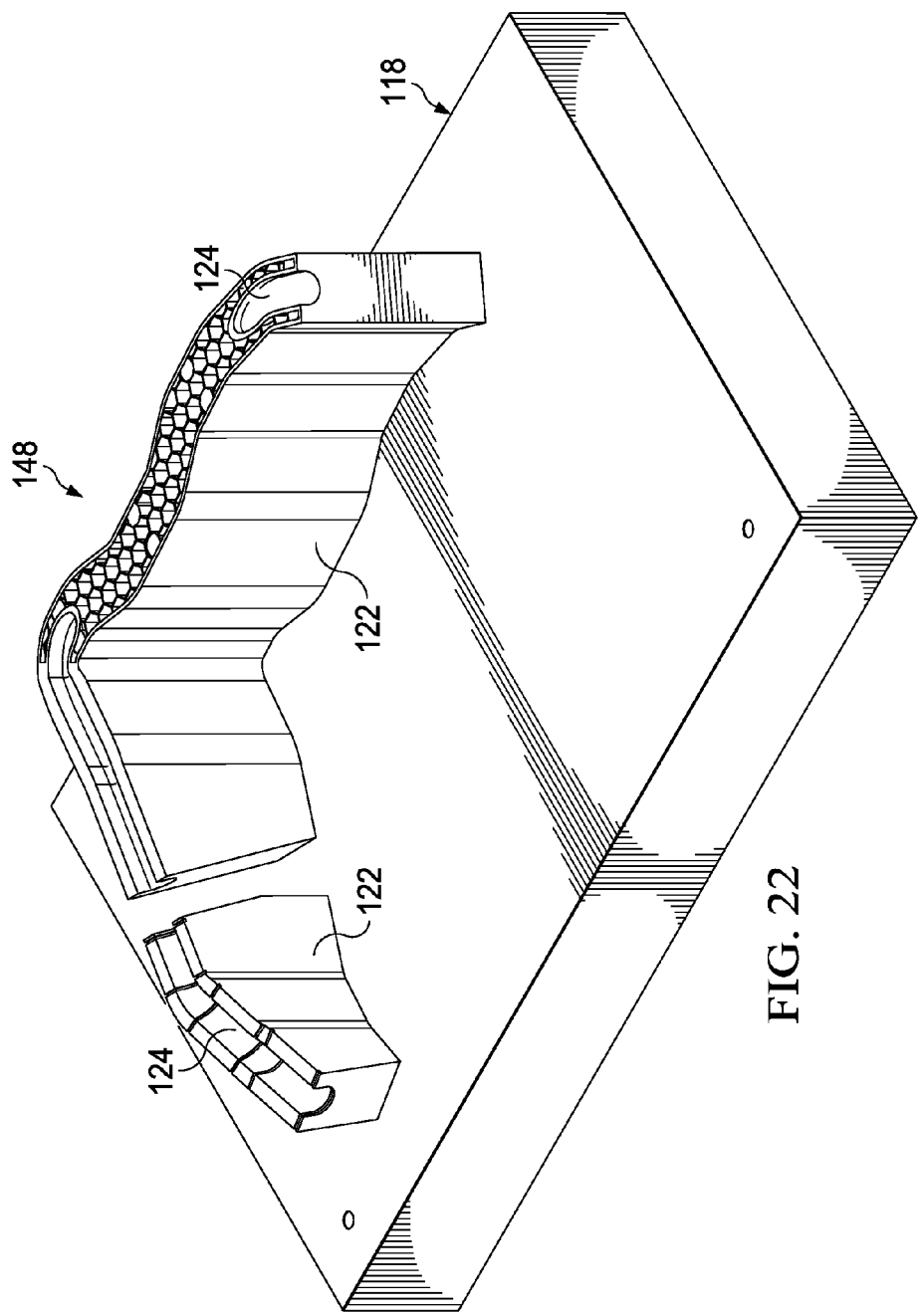
Figure 23:
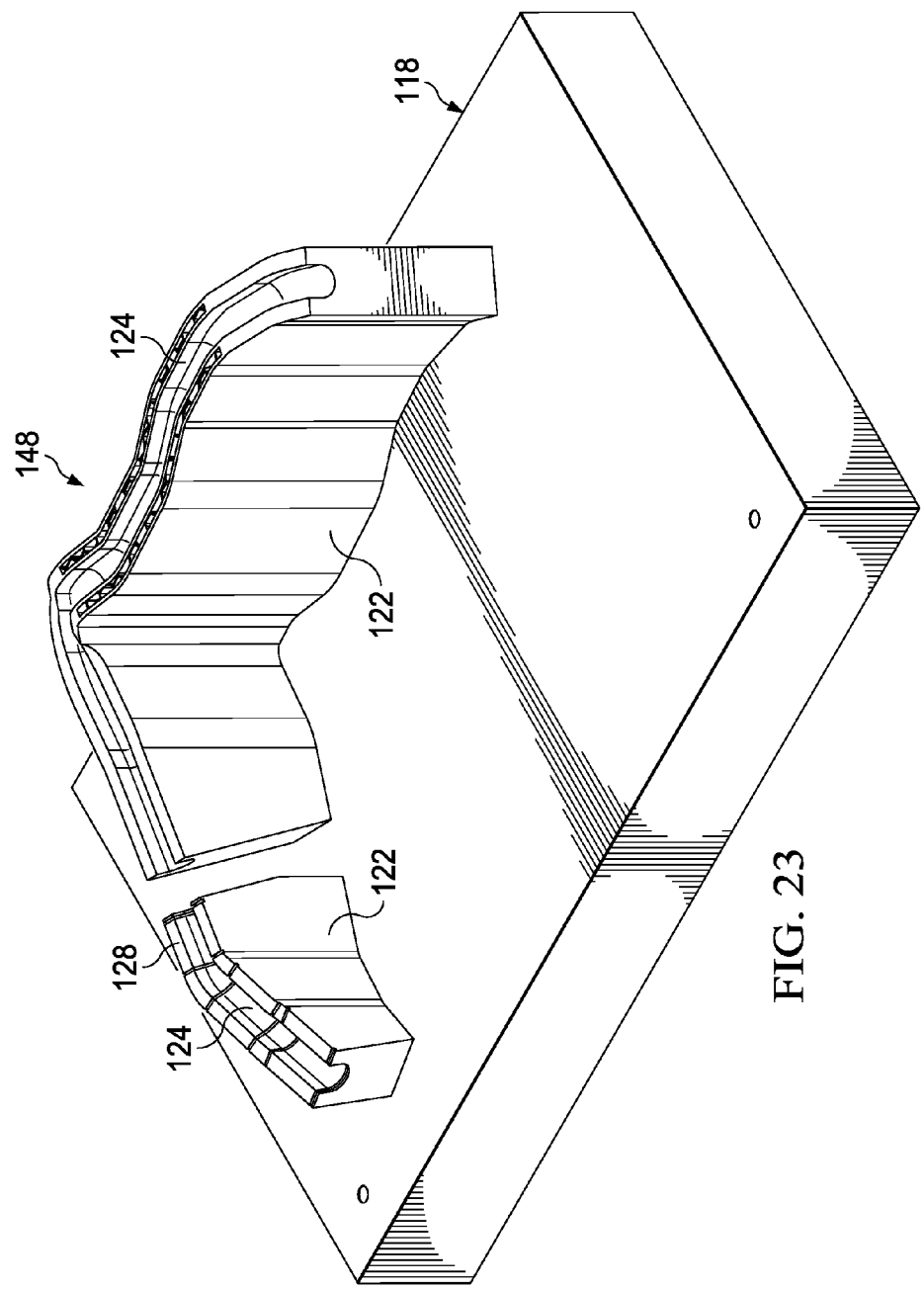
Figure 24:
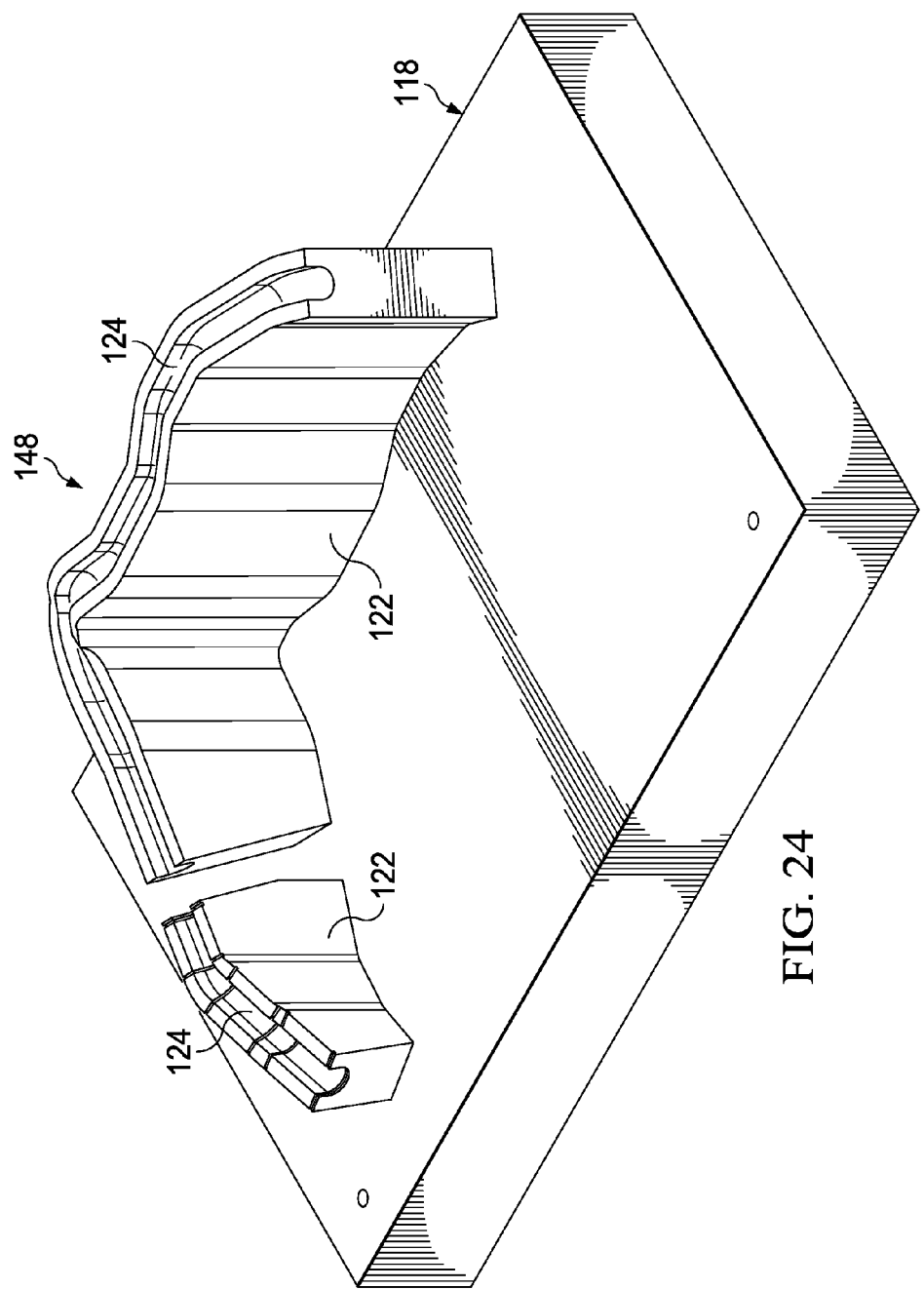
Figure 25:
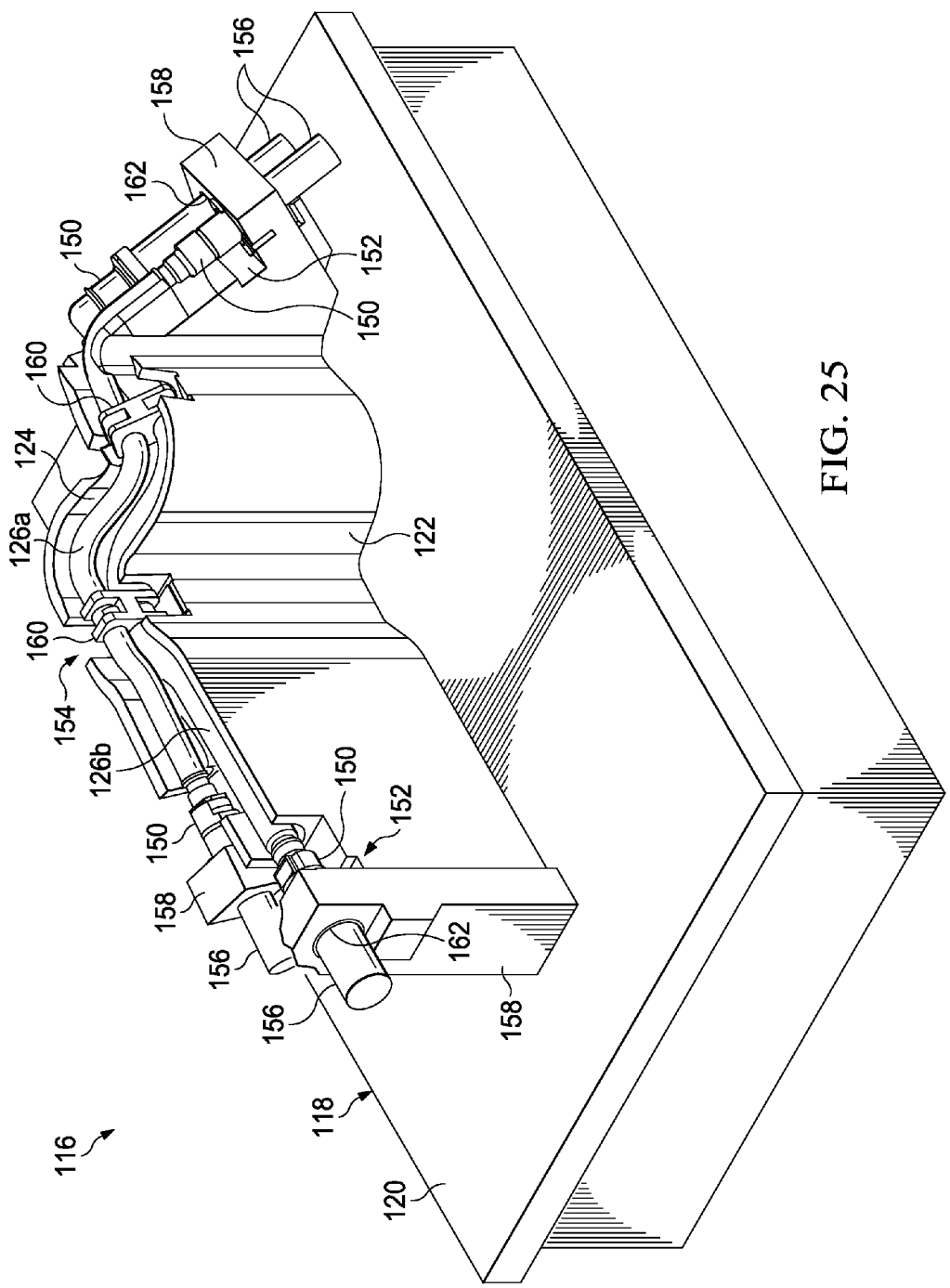
FIGS. 25 and 26 are perspective views of a gauge for checking a 2 tube assembly, showing the position of the tube in the gauge.
Figure 26:
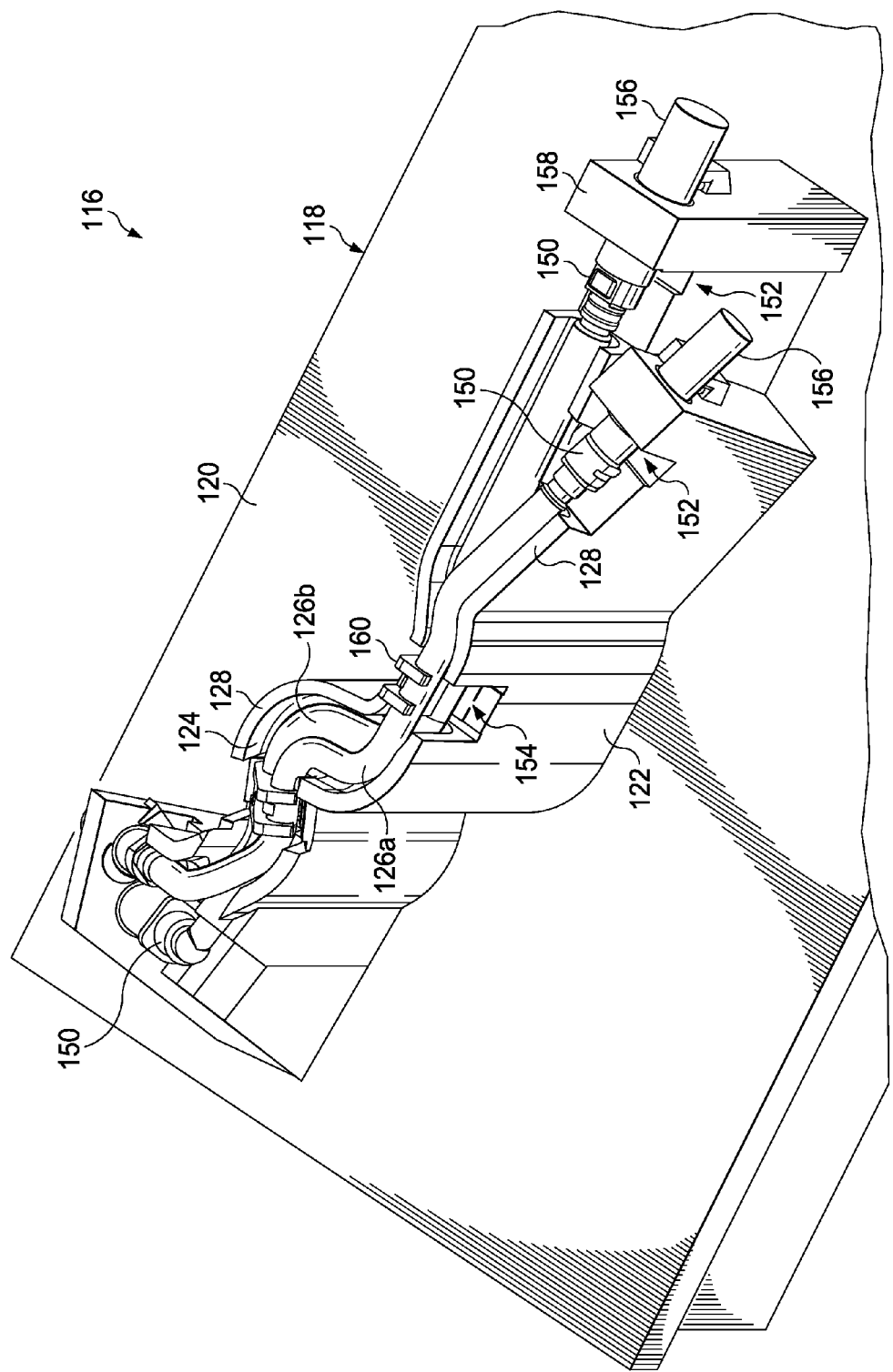
Figure 27:
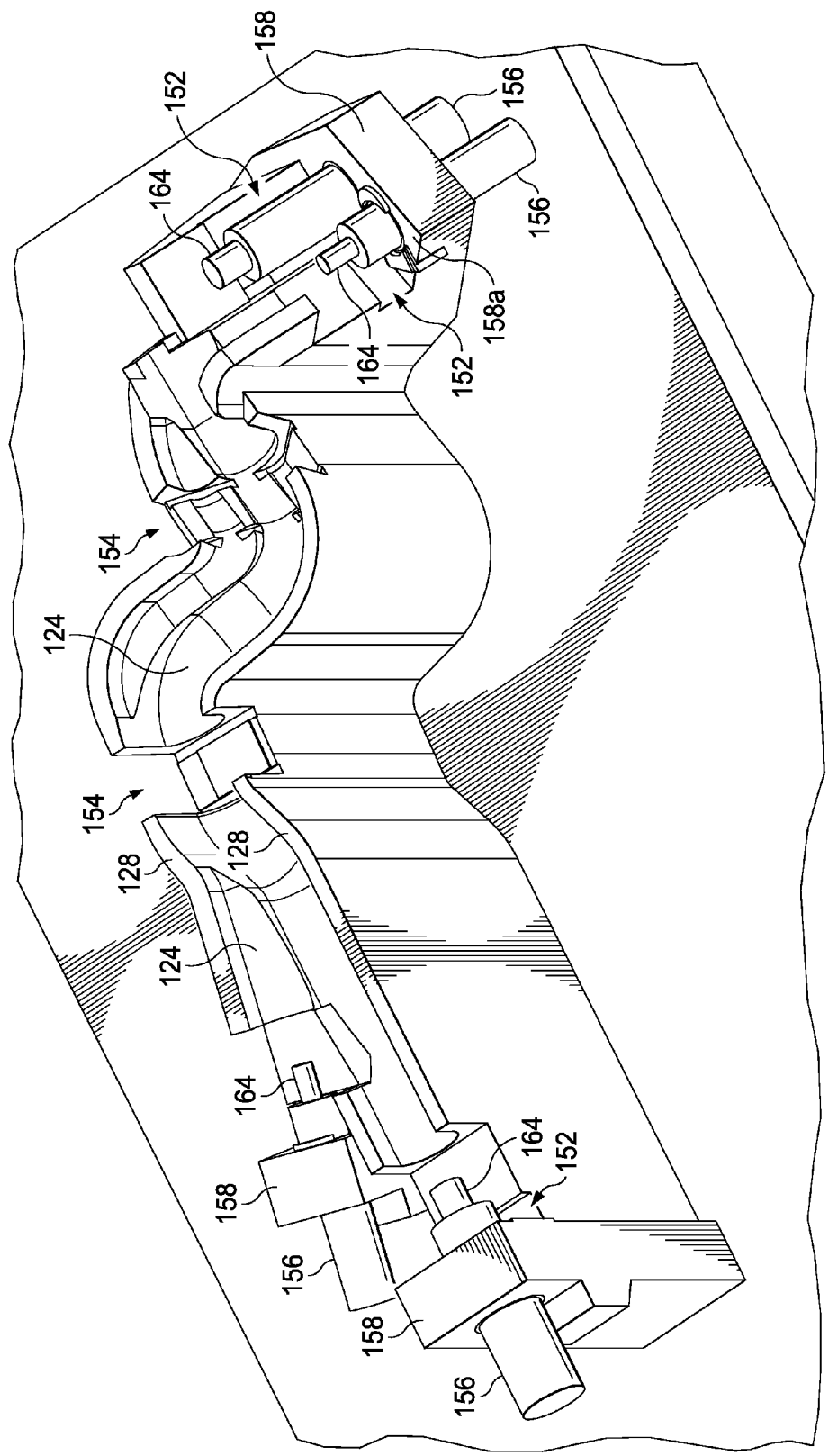
FIG. 27 is a perspective view of the gauge shown in FIGS. 25 and 26, with the tube assembly removed.
Figure 28:
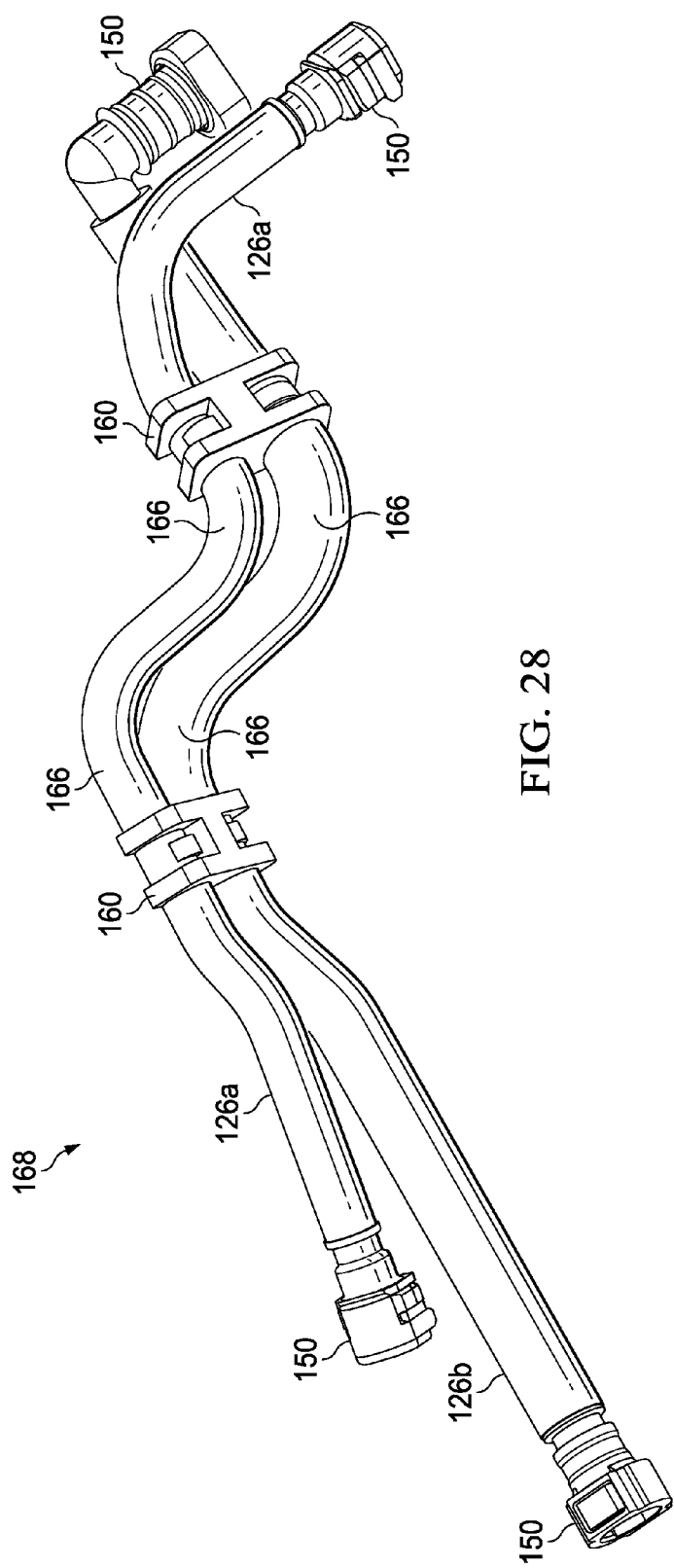
FIG. 28 is a perspective view of the 2 tube assembly shown in FIGS. 25 and 26.

In FIG. 16, the footprint of the gauge blocks to be built is shown at 142. With the base 118, including the base surface 120 having been fabricated, the gauge blocks 122 are then fabricated, layer-by-layer, as shown in FIGS. 17-24. As the gauge blocks 122 are being formed, the tube channels 124 are likewise formed, layer-by-layer. FIG. 19 illustrates the initial partial formation of a tube channel 124 in one of the gauge blocks 122. Since both the base 118 and the gauge blocks 122, including the tube channels 124 are digitally manufactured within a common reference system, the tube channels 124 are precisely located, sized and swept to match the 3-D CAD model of the tube 126, but with built-in tolerance boundaries.

Attention is now directed to FIGS. 25-30 which illustrate a typical gauge 116 fabricated using the additive manufacturing technique described above. The gauge 116 may be used to check conformance of a tube assembly 168 (see FIG. 28) with one or more reference standards related to feature location, bend point/angles 166, sweep angles, length etc. The tube assembly 168 comprises first and second tubes 126a, 126b each provided with end fittings 150 which adapt the tube to be coupled with other functional components (not shown). The tubes 120a, 126b may be held together in a desired relative orientation of by tube clips 160. In the illustrative example, the gauge 116 comprises a single gauge block 122 having multiple tube channels 124 for checking fit the individual tubes 126a, 126b. The gauge 116 includes tube centering end pins 156 which are longitudinally slidable through openings 162 (FIG. 25) in end pin support blocks 158 that are integrally formed with the gauge block 122, and which may be also integrally formed with the base 118. Each of the end pins 156 includes an ID locator which is marginally smaller than the inside diameter of a corresponding tube 126a, 126b. The end pins 156 function as reference stops to locate the ends of the tubes 126a, 126b, including the tube end fittings 150, as well as to center the ends of the tubes 126a, 126b within the tolerance boundaries provided within the tube channels 124.

Figure 29:
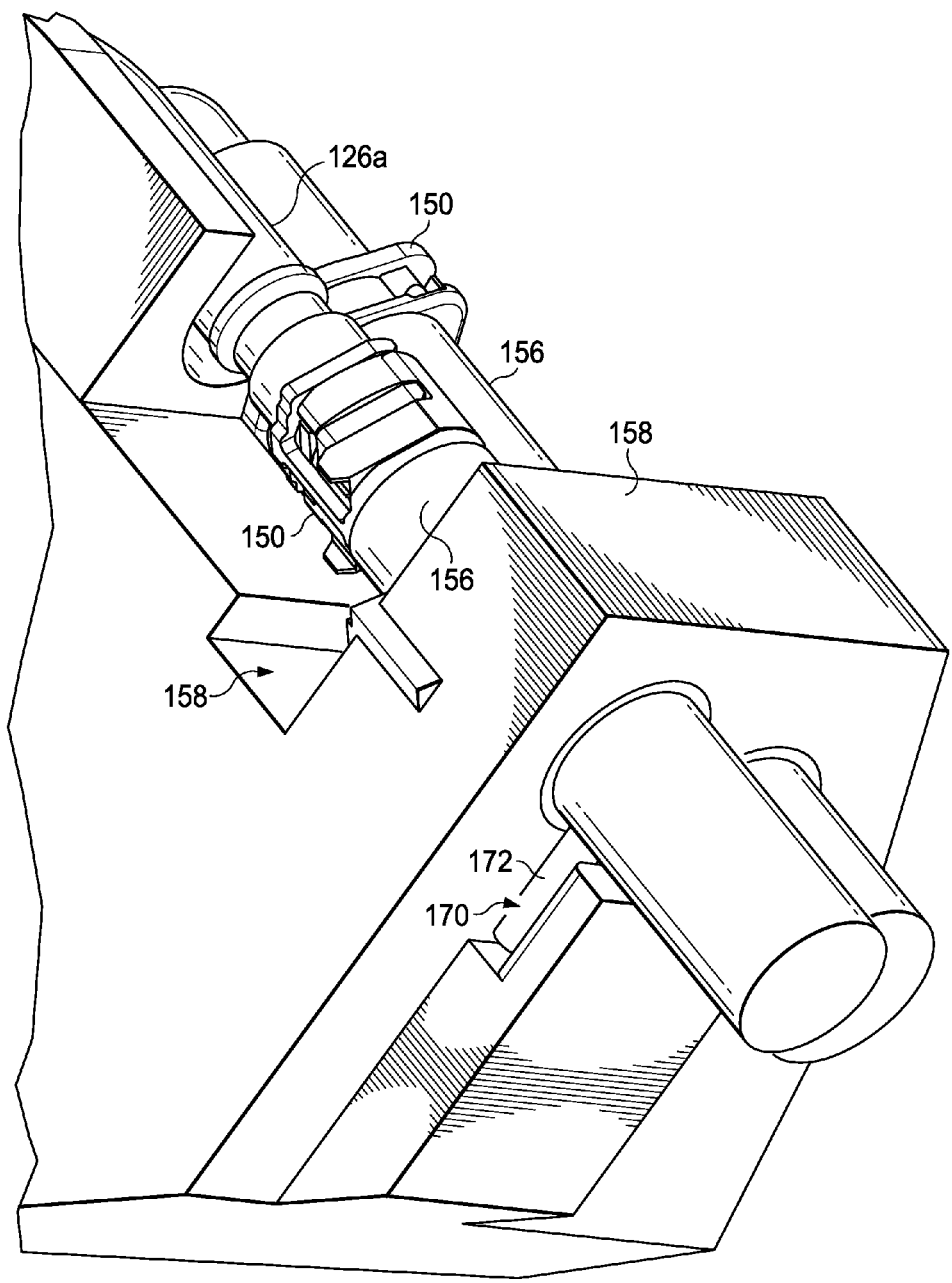
FIG. 29 is a perspective view of one end of the gauge shown in FIGS. 25-27, illustrating in more detail the relationship of the tubes and the tube centering pins.
Figure 30:
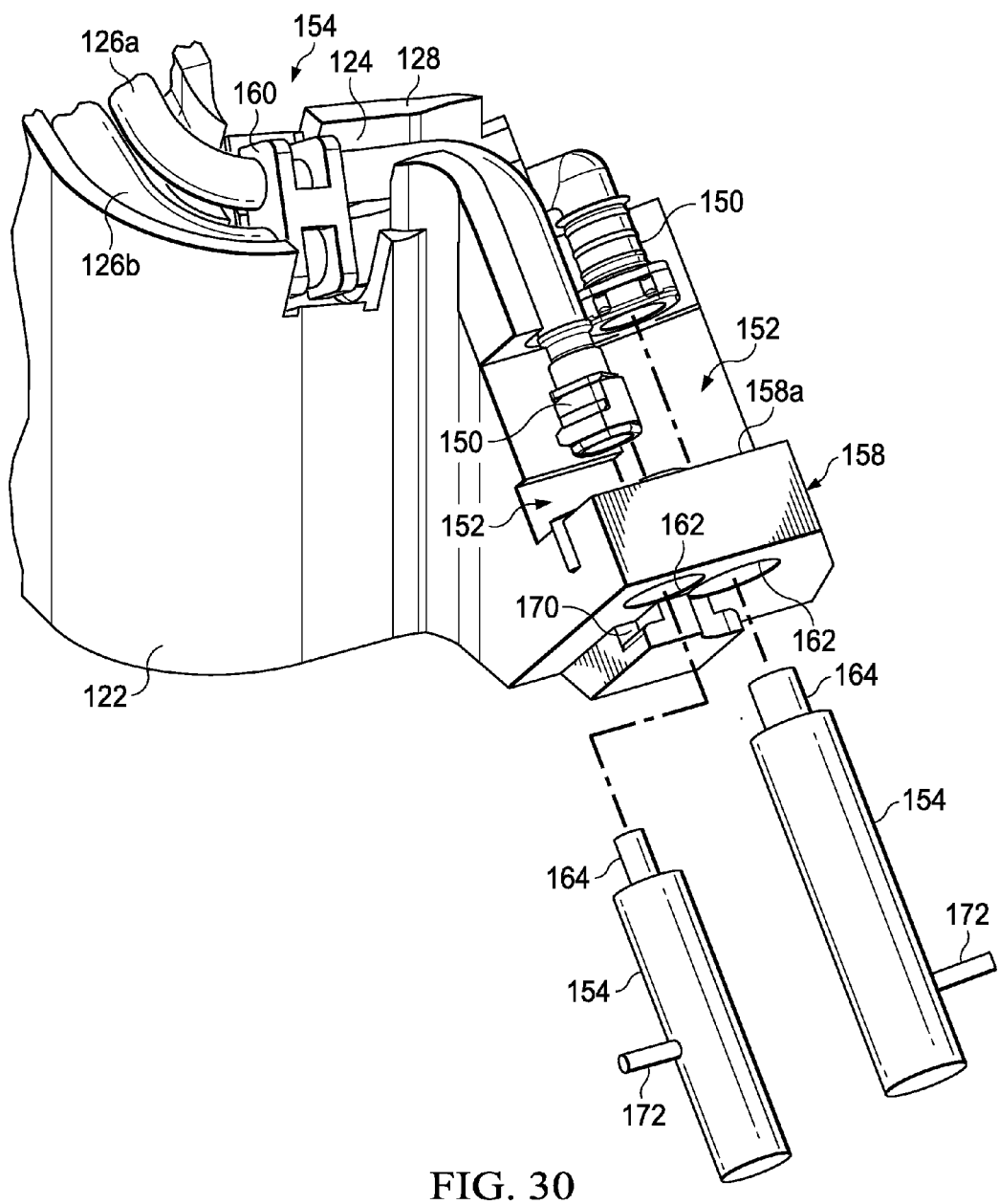
FIG. 30 is a perspective view of one end of the gauge shown in FIGS. 25-27 and 28, the tube centering pins exploded, and better revealing the tolerance markers.

As best seen in FIGS. 29 and 30, each of the end pins 156 includes a locking mechanism comprising a keeper arm 172 that is received within a corresponding slot 170 in a support block 158. Initially, the end pins 156 are retracted to provide clearance so that the tubes 126a, 126b can be placed in the tube channels 124. The ends of the tubes 126a, 126b, or in the illustrated example, the end fittings 150, engage the ends of the end pins 156 and may, at one extreme, rest against faces 158a of the support blocks 158. However, if either of the tubes 126a, 126b is too long and therefore out of tolerance, it will not be possible for inspector to place the tube assembly 168 in the gauge 116 because of interference of the ends of the tubes 126a, 126b with the support blocks 158. However, assuming that the tubes 126a, 126b are not too long, the tube assembly 168 is placed on the gauge 116, and the end pins 156 are then extended, causing the ID locators 164 to enter the inside diameter of the tubes 124a, 124b, and/or the end fittings 150, depending upon the configuration of the tubes 126 and thereby center the ends of the tubes 126a, 126b. With the ends of the end pins 156 engaging the ends of the tubes 126a, 126b, the end pins 156 are then rotated until the keeper arms 172 enter the corresponding slots 170, thereby locking the ends of the tubes 126a, 126b in place in a desired location and orientation.

A tolerance marker area 152, which may or may not be color-coded, is integrally formed with the gauge blocks 122, adjacent the support block faces 158a. The illustrative example, the tolerance marker area 152 comprises a visual recess in a portion of the gauge block 122. If the end of a tube 126 (or end fitting 150) lies within the marker area 152, then the length of the tube 126 is too long and an inspector can quickly visually determine that the tube is out of tolerance. However, if the longitudinal position of the end of the tube 126 (or the end fitting 150) lies outside of the marker area 152, then the tube 126 can be seen to be within the desired length tolerance.

One or more cutouts 154 may be provided in the sidewalls of the tube channels 124, either to provide lateral clearance for tube clips 160 and/or to allow an inspector to grasp the tube assembly 168 so that it can be removed from the gauge 116.

Figure 32:
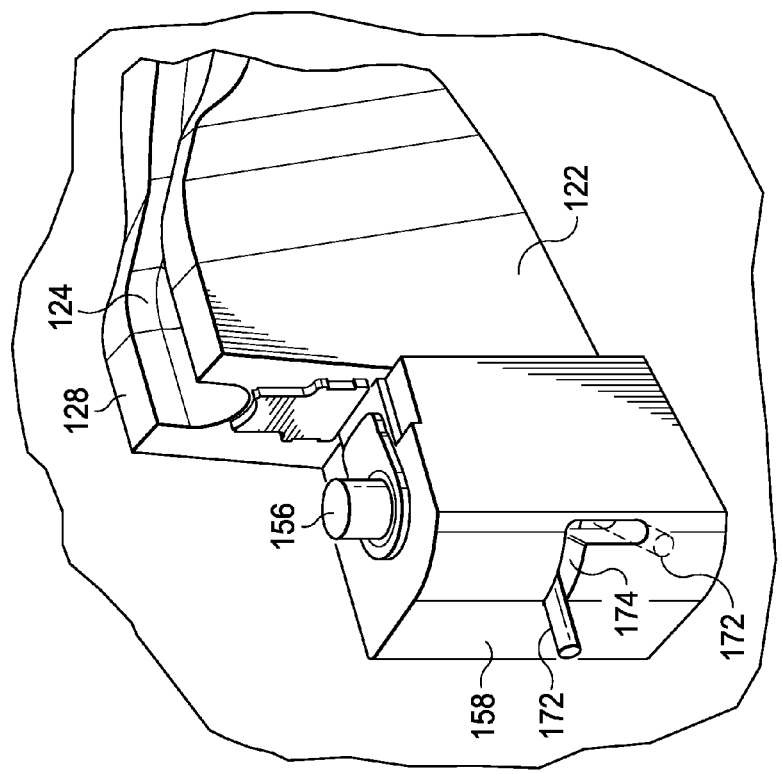
FIG. 32 is a perspective view of the centering pin and pin support block shown in FIG. 31, showing both locked and unlocked positions of the pin.
Figure 31:
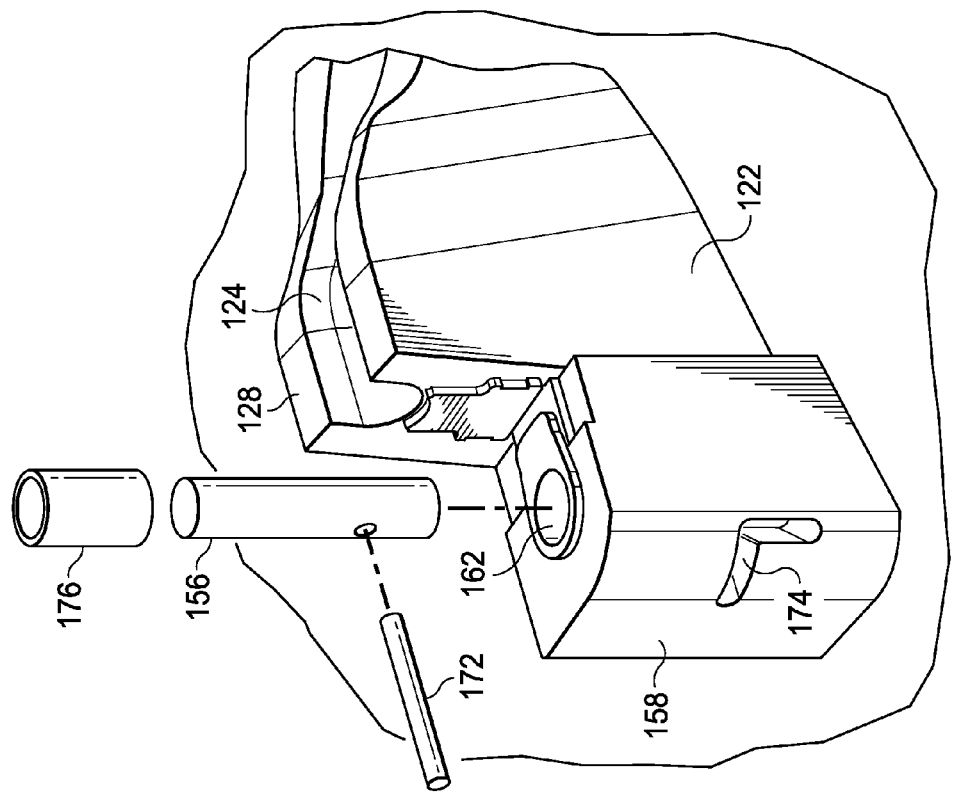
FIG. 31 is an exploded, perspective view of a tube centering pin and pin support block.

FIGS. 31 and 32 to illustrate an alternate construction for locking the end pins 156 in place. In this example, an L-shaped slot 174 is formed integral with the support blocks 158 as the support blocks 158 are being fabricated layer-by-layer during the additive manufacturing process. In one position, the keeper arm 172 allows the end pin 156 to be retracted so that a tube 126 may be either placed in or removed from the tube channel 124. Once the tube 126 is in place in the tube channel 124, the keeper arm 172 is shifted longitudinally and laterally to the opposite end of the slot 174, thereby locking the end pin 156 in place.

Figure 33:
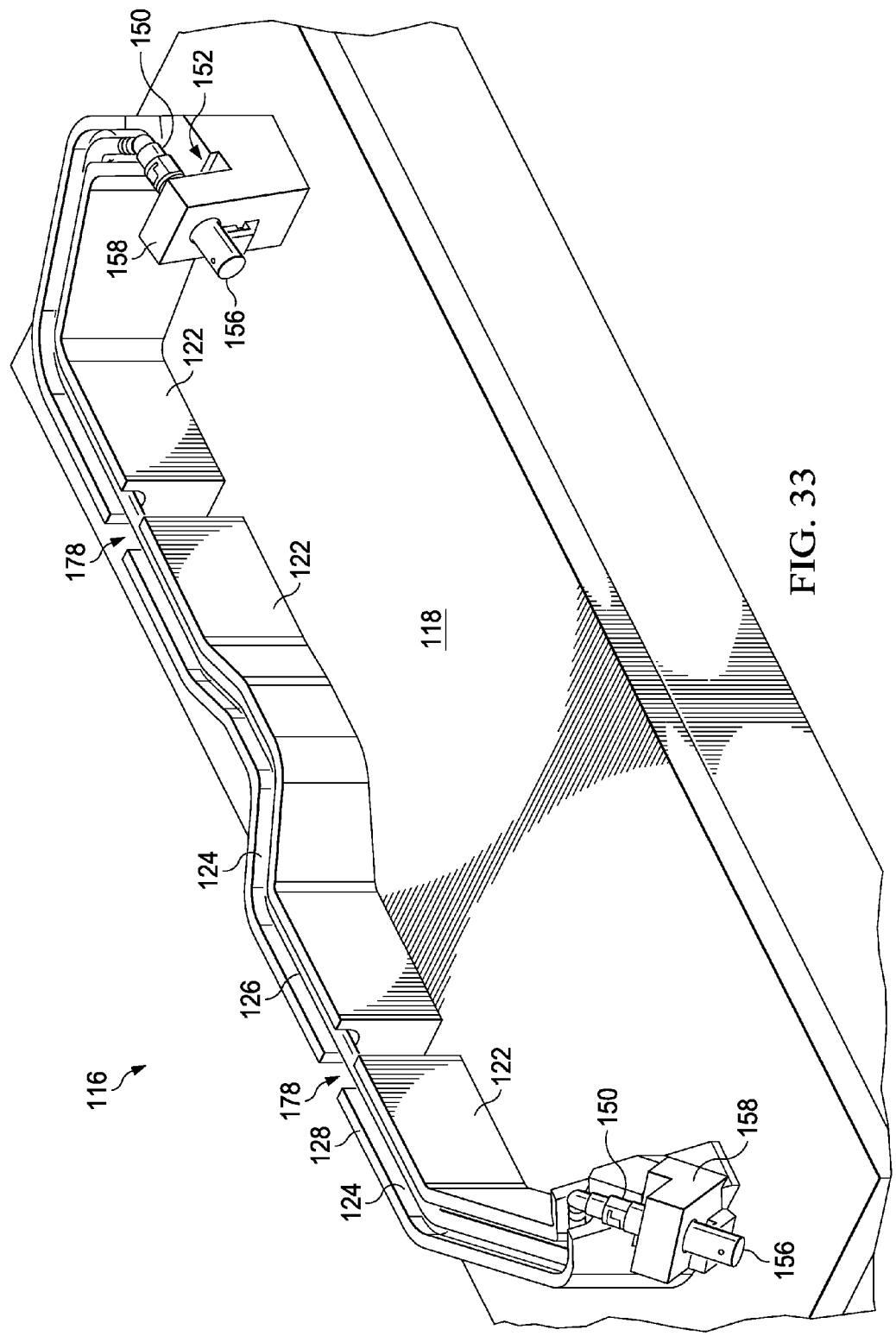
FIG. 33 is a perspective view of an alternate embodiment of the checking gauge having multiple gauge blocks for checking a single tube.
Figure 34:
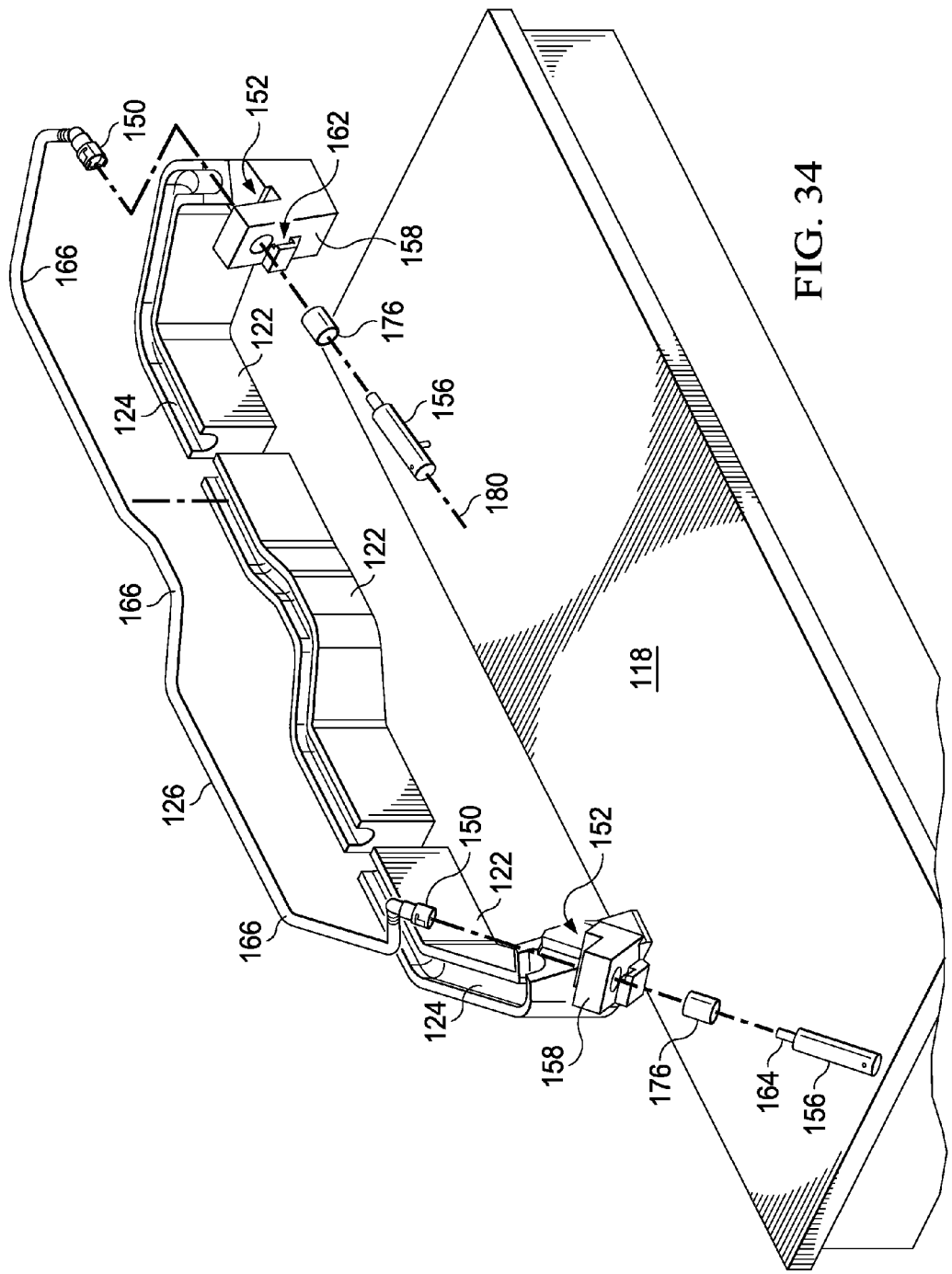
FIG. 34 is a perspective, exploded view of the gauge shown in FIG. 33.

FIGS. 33-34 illustrate another example of the disclosed the gauge 116 which comprises 3 gauge blocks 122 used to check a single tube 126. The gauge blocks 122 may be slightly spaced apart to form a gaps 178 therebetween which may facilitate grasping the tube 26 to remove it from the gauge 116 following a checking procedure. The gauge blocks 122 may be integrally fabricated with a base 118 during the additive manufacturing process such that they are precisely pre-positioned relative to each other and the tube channel 124 is precisely aligned within the gauge blocks 122 along the entire length of the gauge 116, in spite of the presence of gaps 178.

Figure 35:
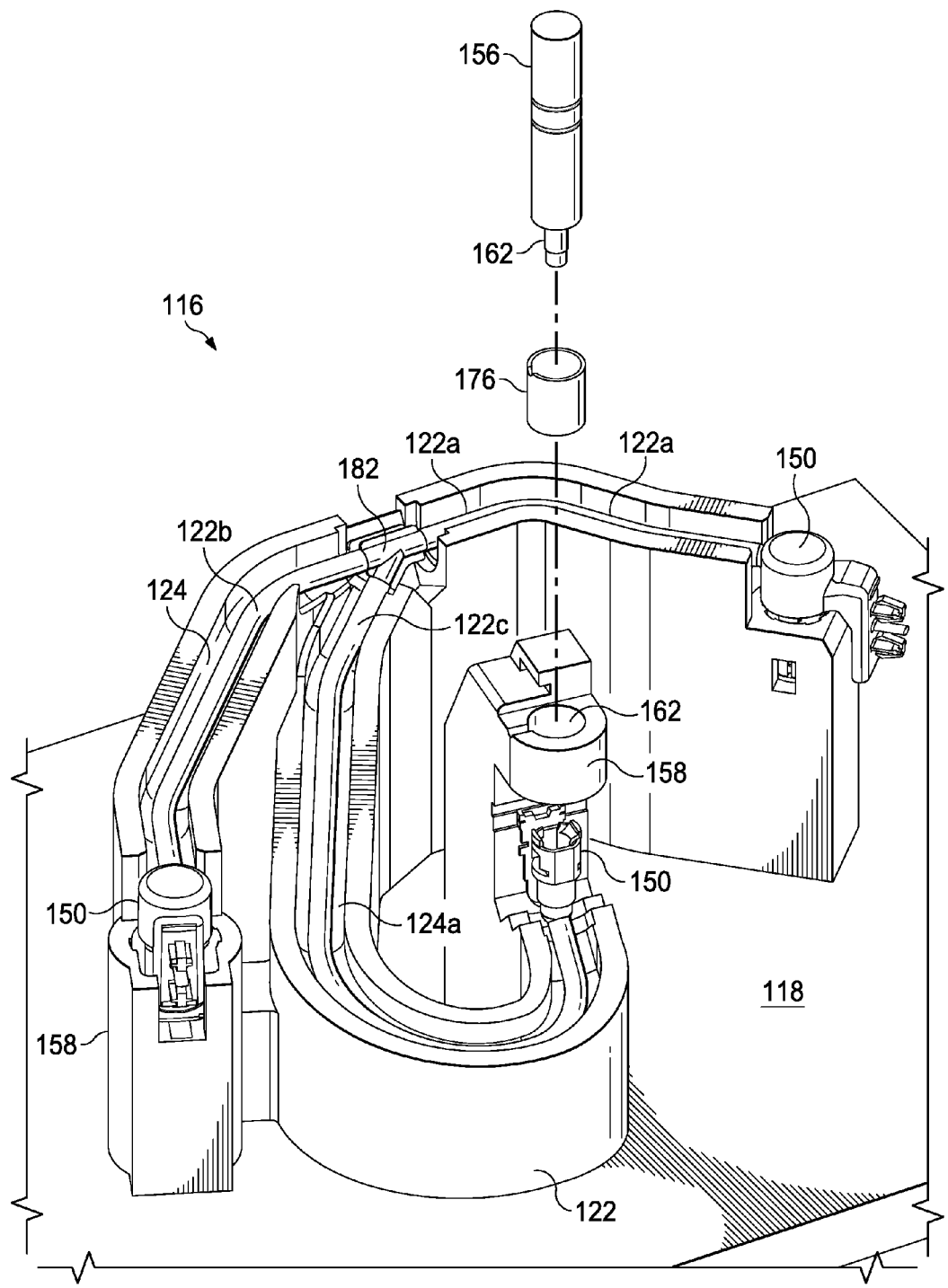
FIG. 35 is a perspective view of still another embodiment of the gauge for checking a tube assembly having multiple sections coupled by a connector.

FIG. 35 illustrates another embodiment of the disclosed gauge 116 in which a tube assembly may be checked which includes three tube sections 122a, 122b, 122c connected together by a tube coupler 182. The tube sections 122a, 122b, 122c are received within three corresponding tube channels 124 integrally formed in a single gauge block 122. In this example, a bushing 176 fixed within the pin opening 162 in support block 158 acts as a bearing surface for slidably receiving an end pin 156.

Figure 36:
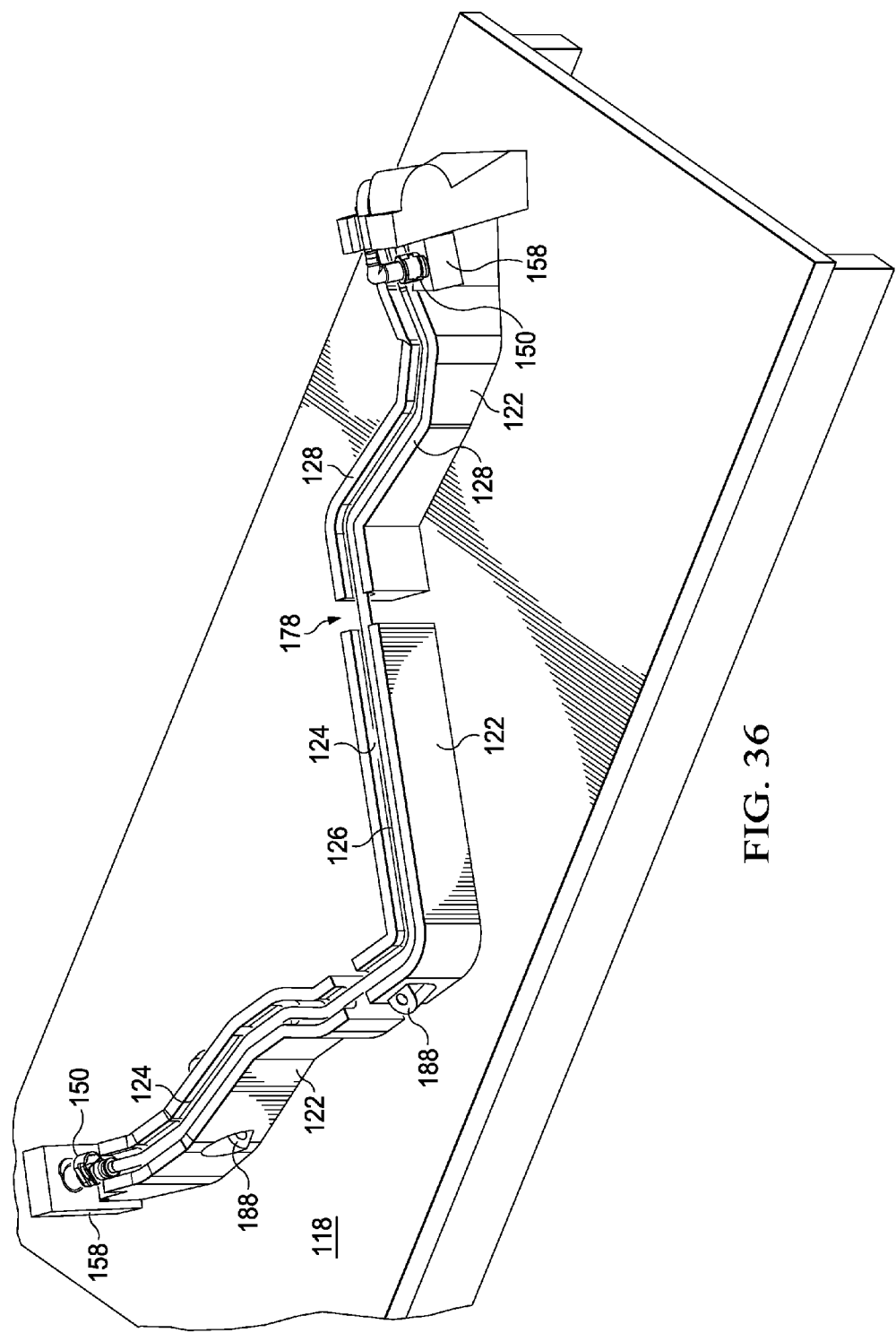
FIG. 36 is a perspective view of a gauge having multiple gauge blocks mechanically fastened to a separate base.
Figure 37:
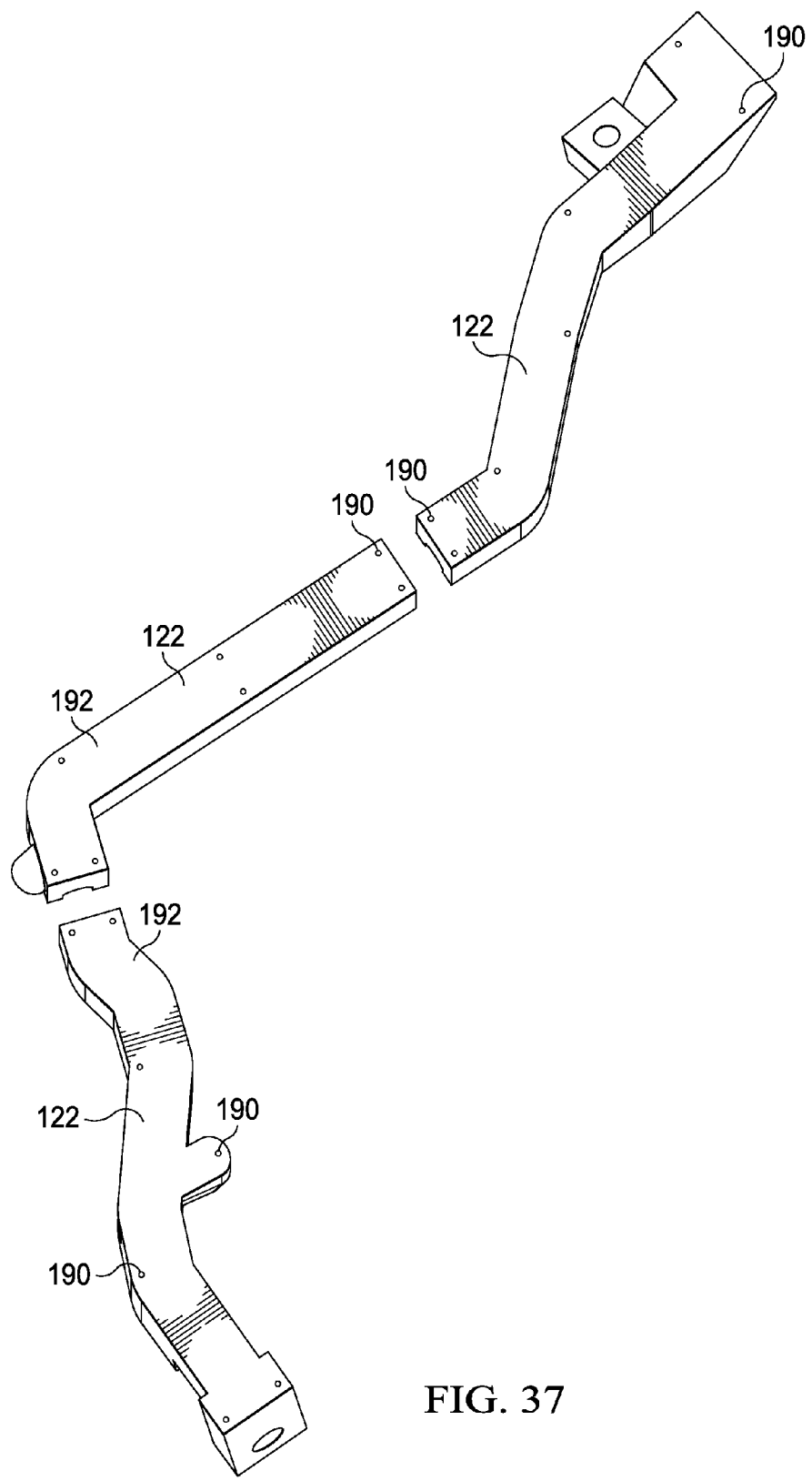
FIG. 37 is a perspective view of the gauge blocks shown in FIG. 36, illustrating the flat bottoms of the gauge blocks having mounting holes.

FIGS. 36 and 37 illustrate a further example of the disclosed gauge 116 which comprises three separate gauge blocks 122 that are mounted on a common base 118. In this example, each of the gauge blocks 122 is separately produced using the additive manufacturing process previously described, but each of the gauge blocks 122 is manufactured separately from, rather integrally with the base 118. This technique may be used where there may be limitations on the size of the parts that may be manufactured with the additive manufacturing machine 104. The base 18 may be made of any suitable material, which may be the same or different from the material from which the gauge blocks 122 are fabricated. Each of the gauge blocks 122 may be provided with integrally formed alignment touch points 188 that y be contacted, for example, using a coordinate measuring machine to aid in locating and positioning and aligning the gauge blocks 122 relative to each other on the base 118.

Figure 38:
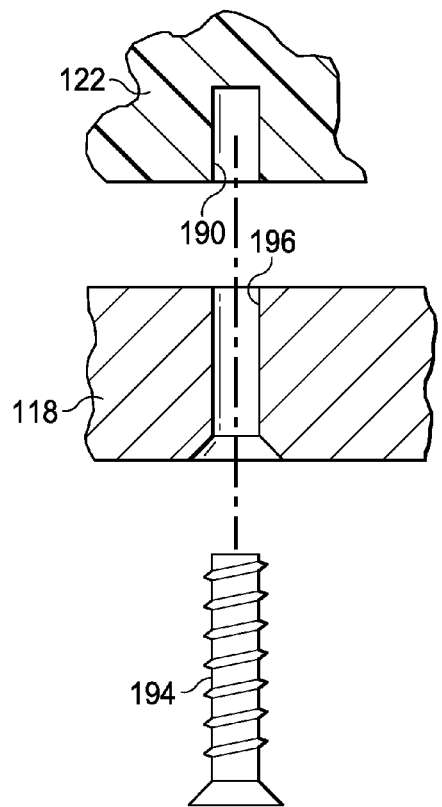
In FIG. 38 is a sectional view illustrating a method of attaching the gauge blocks shown in FIGS. 36 and 37 to the base using fasteners.

As shown in FIG. 37, the bottom of each of the gauge blocks 122 lies substantially flat, and may include mounting holes 190 that are integrally formed with the gauge blocks 122 during the additive manufacturing process, so that they are pre-aligned with respect to each other. Referring to FIG. 38, screws or similar fasteners 194 may be inserted through fastener openings 196 in the base 118. The fasteners 194 are received within the mounting holes 190 in the gauge blocks 122. The fastener openings 196 in the base 118 may be formed by automated equipment, such as a mill or drill that is controlled by the computer 106 which locates the fastener openings 196 in the locations necessary to effectively pre-align the gauge block segments 122 when they are installed and fastened to the base 118.

Figure 39:
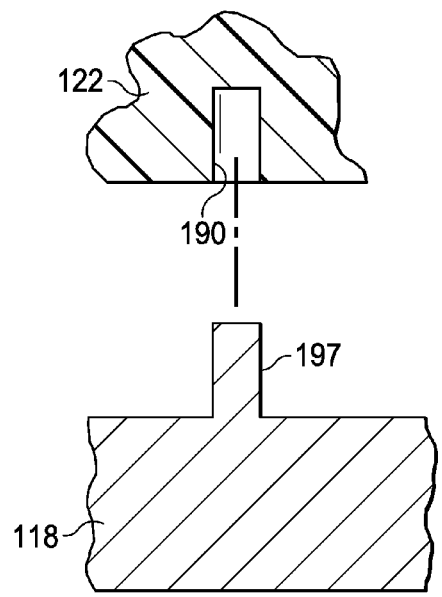
FIG. 39 is a sectional view illustrating a method of attaching the gauge blocks shown in FIGS. 36 and 37 to the base using integrally formed, mating dowels and mounting hole.

Other techniques may be employed to align and mount the gauge blocks 122 shown in FIG. 37 on the base 118. For example, referring to FIG. 39, dowels 197 may be integrally formed in the base 118 at the locations necessary to pre-align the gauge blocks 122 relative to each other. The gauge blocks 122 are assembled on the base 118 by aligning the mounting holes 190 with the dowels 197. In still other embodiments, it may be possible to form alignment marks (not shown) on the surface of the base 118 using, for example, a laser, which are used to locate and align the gauge blocks 122 on the base 118. With each of the gauge blocks 122 properly aligned on the base 118, the gauge blocks 122 may be glued to the base 118.

Figure 40:
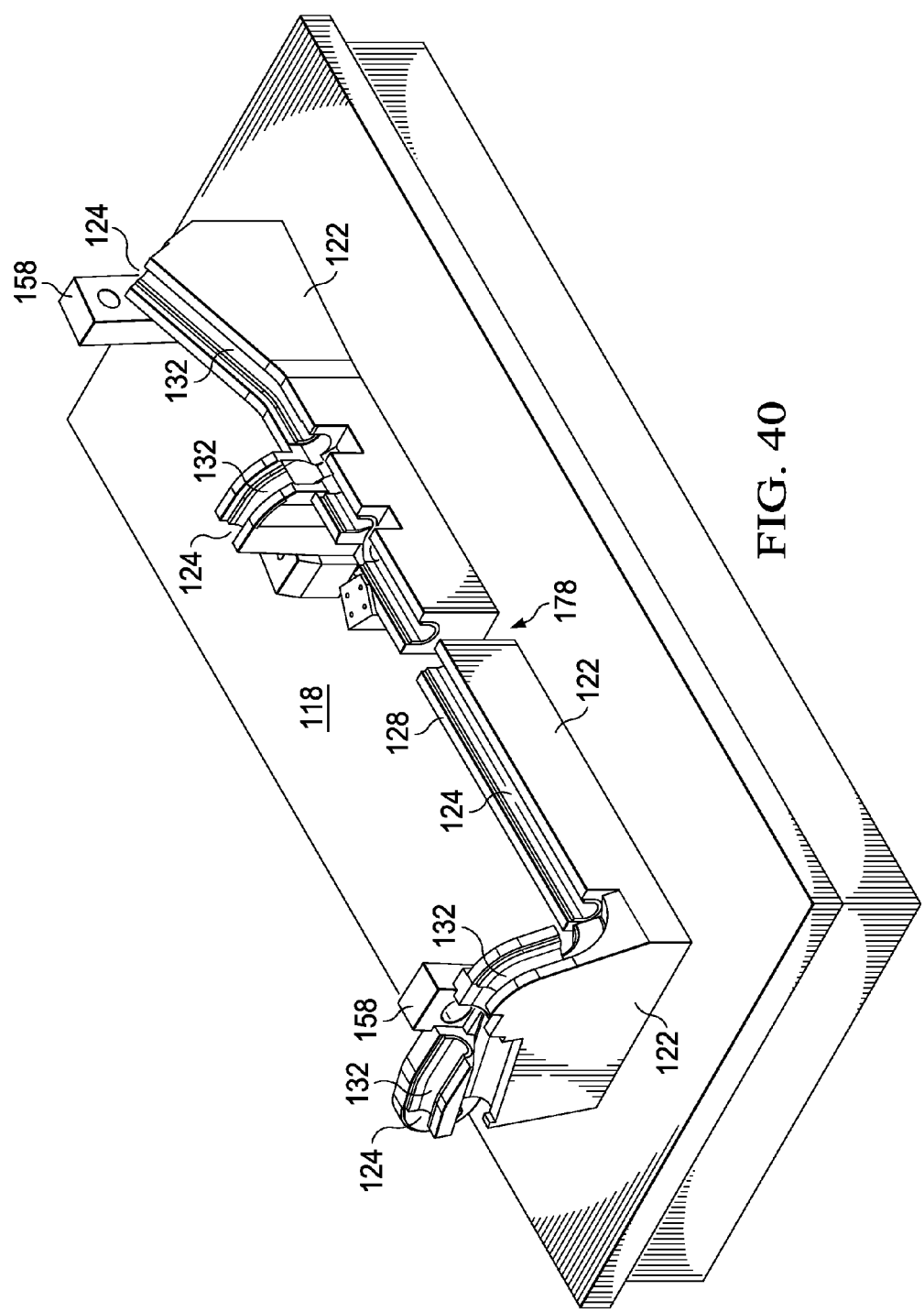
FIG. 40 is a perspective view of another embodiment of the gauge employing snap in, contoured shims.
Figure 41:
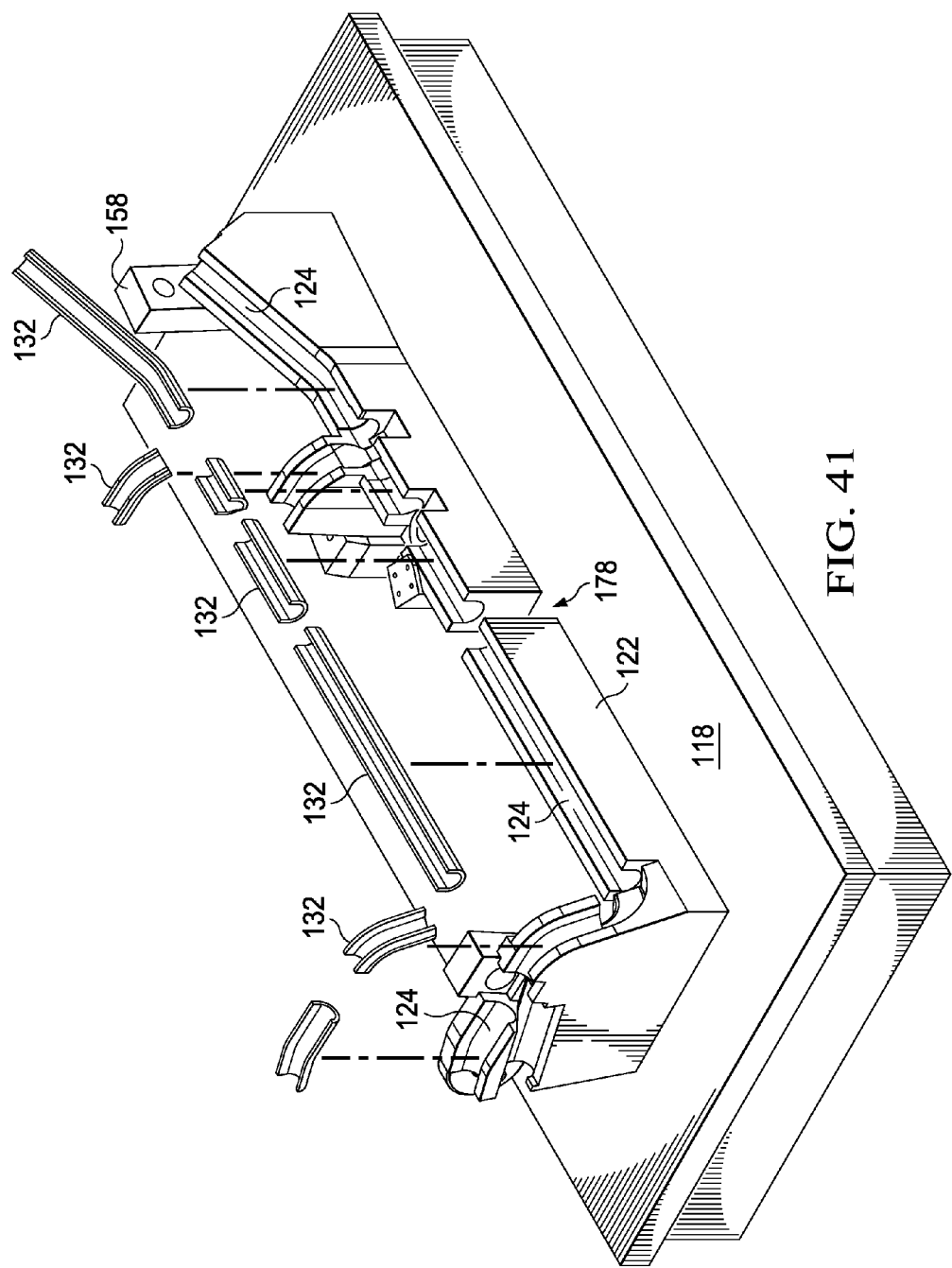
FIG. 41 is a perspective view similar to FIG. 40, but with the shims exploded.
Figure 42:
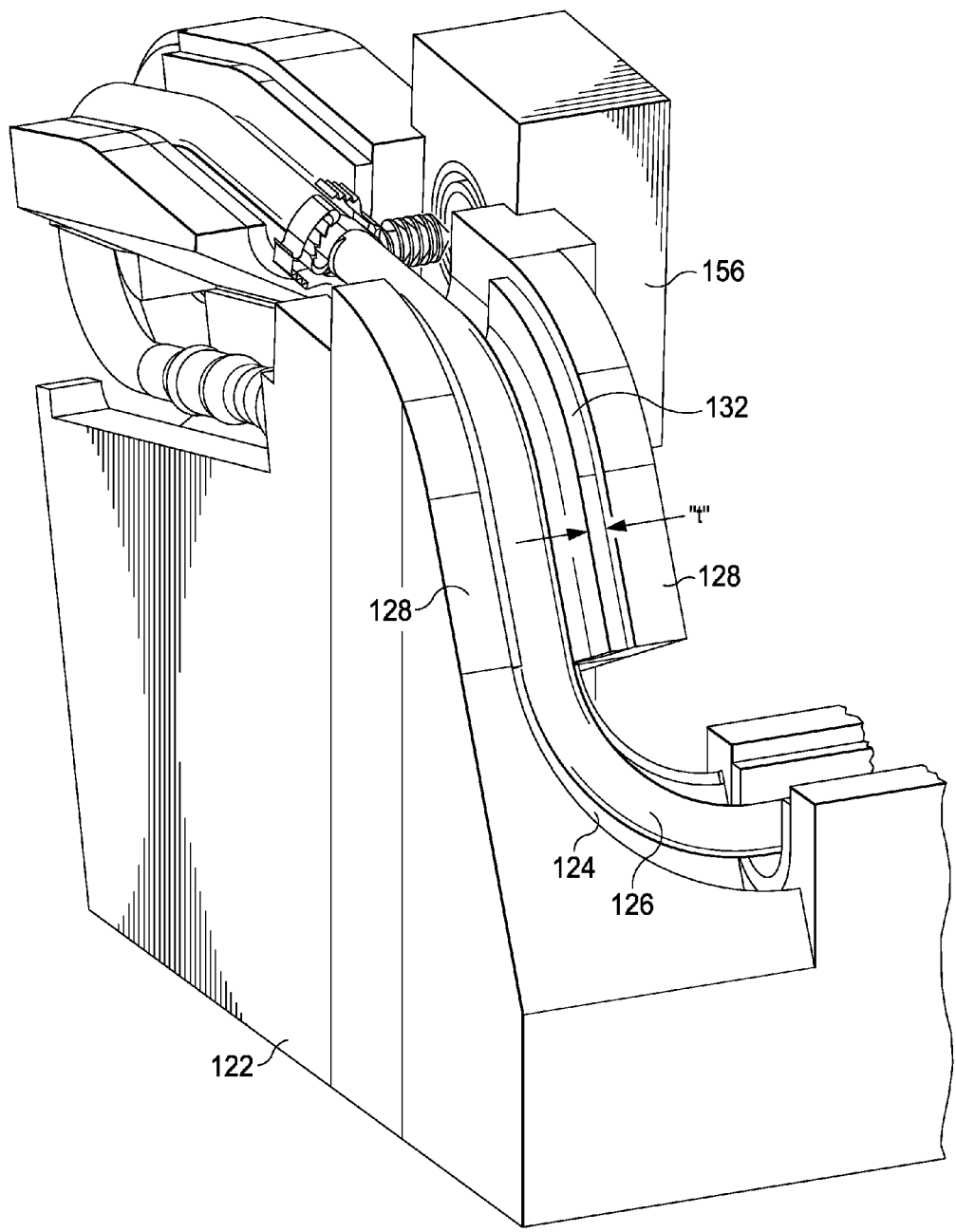
FIG. 42 is a perspective view better illustrating the details of one end of the gauge shown in FIGS. 40 and 41.

FIGS. 40-42 illustrate another embodiment of a gauge 116 that employs two individual gauge blocks 122 separated by a gap 178 and mounted on a base 118, In this example, the insertable shims 132 have contours that match contours in the tube channel 124. As in previous examples, the shims 132 possess a thickness "t" that reduces the tolerance boundary of the tube channel 124 along the inner side walls 127 and bottom 138 (see FIG. 4) of tube channel 124. The contoured shims 132 may be angled slightly outwardly so that they engage and grasp the inner sidewalls 127 of the tube channel 124. The contoured shims 132 may be formed of a material such as nylon, and are both removable and reusable.

Figure 43:
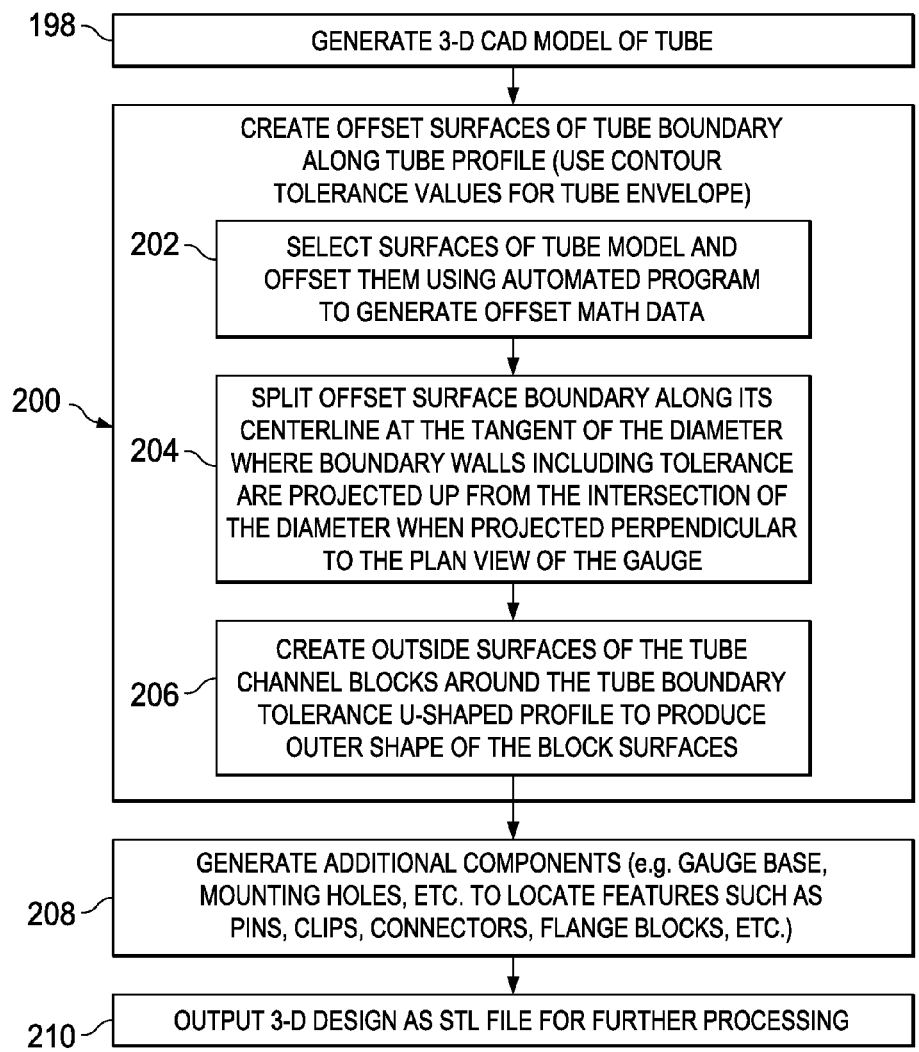
FIG. 43 is a flow diagram illustrating a method of fabricating the disclosed the gauge.

FIG. 43 illustrates certain steps of a method of generating a control program that may be used to digitally fabricate embodiments of the gauge 116 previously describe using additive manufacturing. Beginning at step 198, a 3-D CAD model of a tube 126 is generated. The CAD model may be generated using the computer 106 as part of the design of the tube 126, or may comprise digital data obtained by other means. At 200, a series of steps are carried out using one or more processors 108 of the computer 106 to automatically create offset surfaces of the tube boundary along with the profile of the tube 126. A set of contour tolerance values are generated by the computer 106 used to define the tube envelope.

At 202, surfaces of the 3-D CAD tube model are selected and are offset by the computer 106 using an automated program such as the conversion program 114, or manually to generate offset map data. At 204, the computer 106 splits the offset surface boundary along its centerline at the tangent of the diameter where boundary walls including tolerances are projected up from the intersection of the diameter when projected perpendicular to the plan view of the gauge when 16. At step 206, the computer 106 creates outside surfaces of the tube channel blocks. These outside surfaces are created around the U-shaped tube boundary tolerance profile to produce the outer shape of the gauge block surfaces.

At step 208, the computer 106 designs and generates control programs for fabricating additional components of the gauge, such as a gauge base, mounting holes, etc. in order to locate features such as pins, clips, connectors, flange blocks, etc. Finally, at step 210, a 3-D design is output as a STL file that may be used for further processing, such as to control the additive manufacturing machine 104 (FIG. 1).

Figure 44:
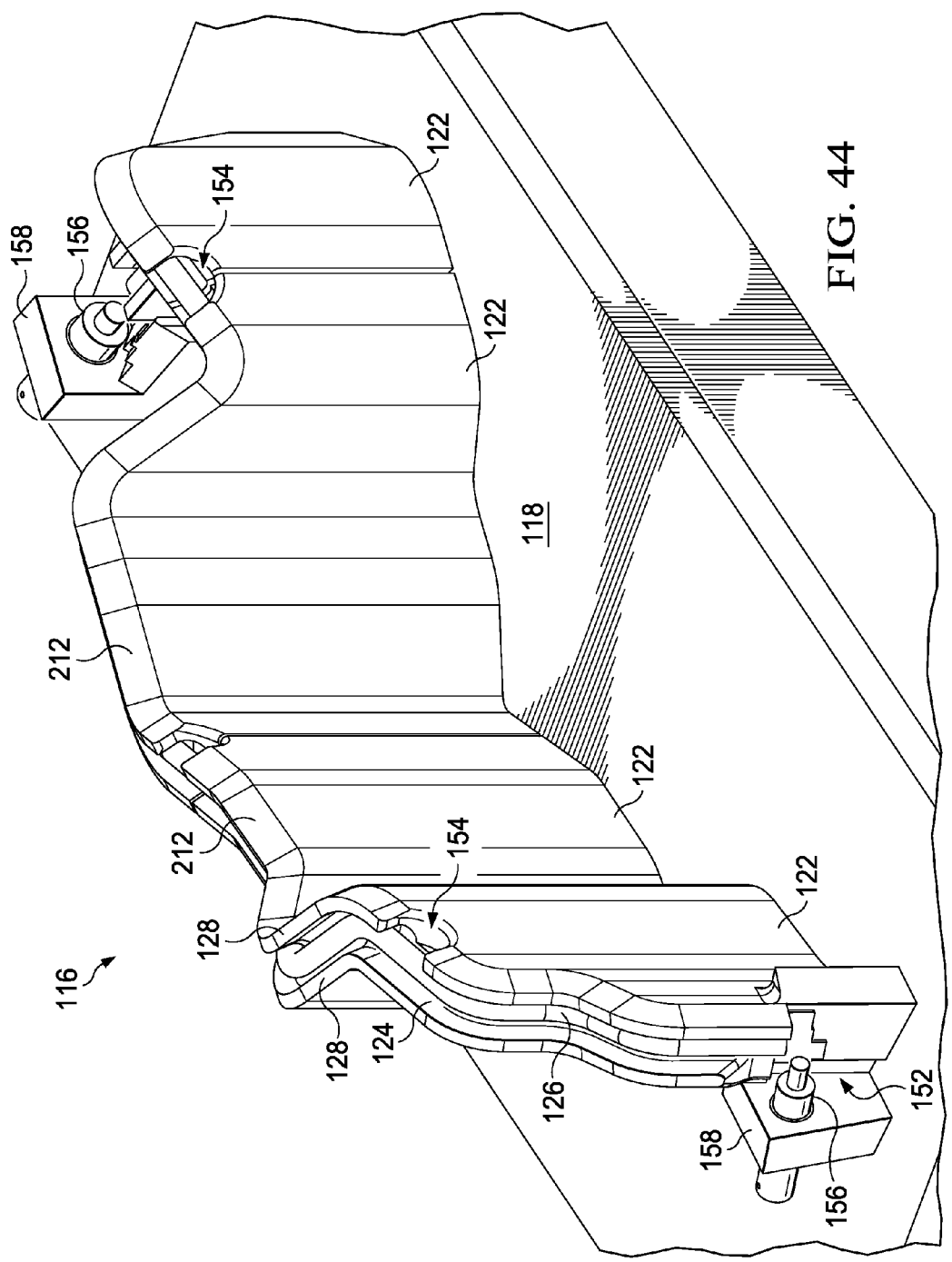
FIG. 44 is a perspective view of another embodiment of the disclosed gauge.

FIG. 44 illustrates a gauge 116, similar to those previously described, which includes multiple gauge block 122 mounted on a base 118 the gauge 116 shown in FIG. 44 may be produced using additive manufacturing techniques and the method previously described. The gauge 116 may include a chamfer 212 on each side of the tube tolerance channel 124, extending outwardly from the upper gauge block surfaces 128. The use of the chamfer 212 facilitates fabrication of the gauge blocks 122 and may aid an inspector in determining whether portions of a tube 126 are above the surfaces 128 and are therefore out of tolerance.

Figure 45:
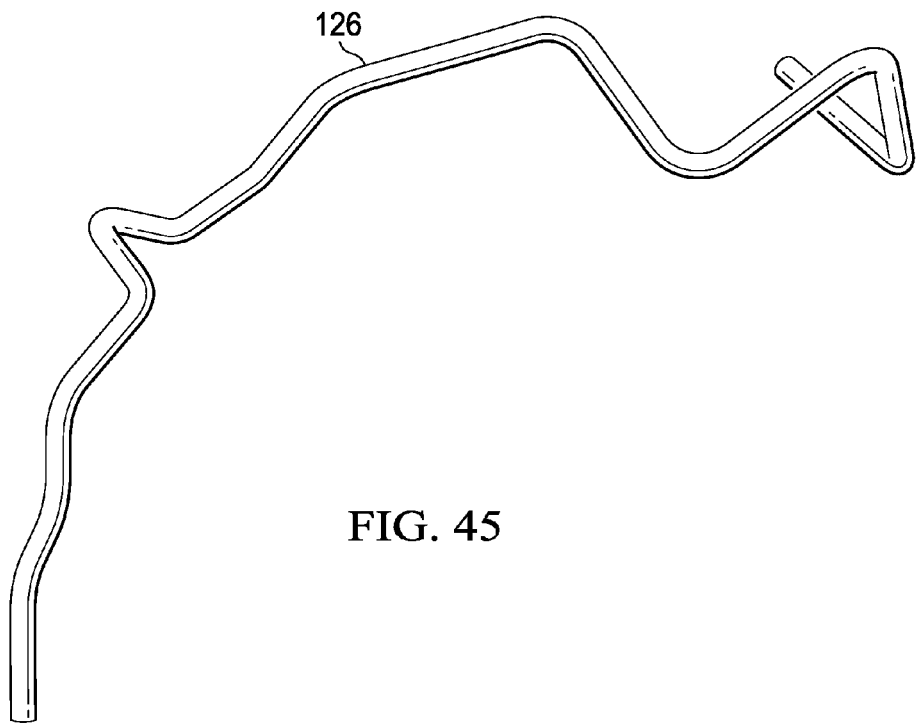
FIGS. 45-59 are perspective views useful in explaining a process for fabricating the gauge shown in FIG. 44.
Figure 46:
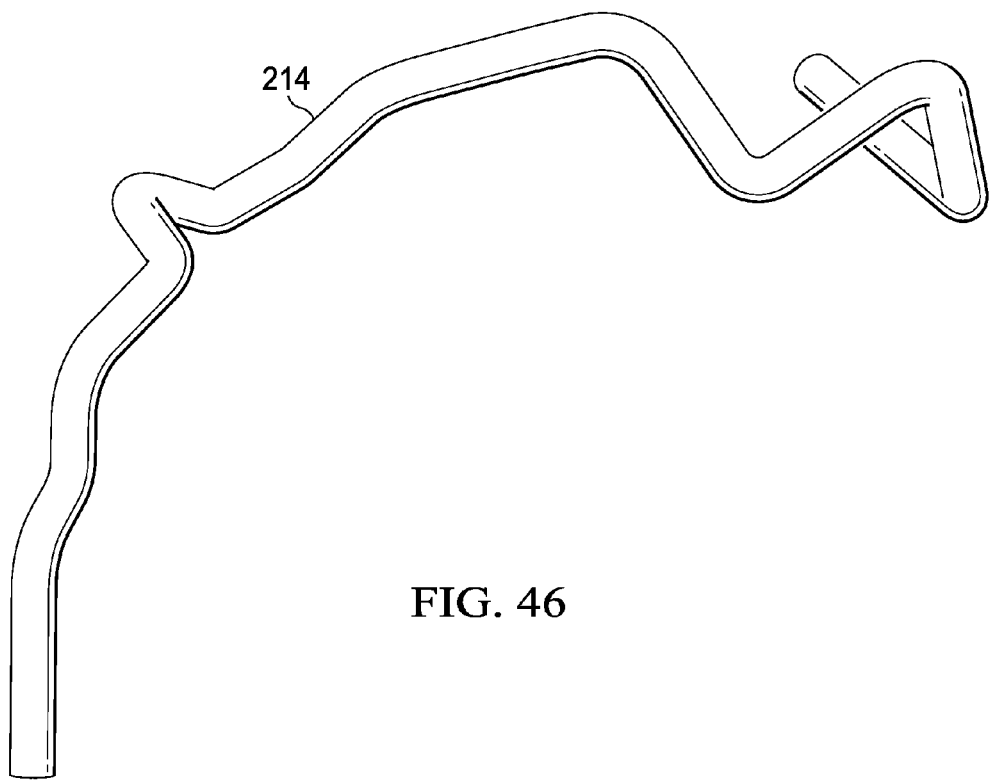
Figure 47:
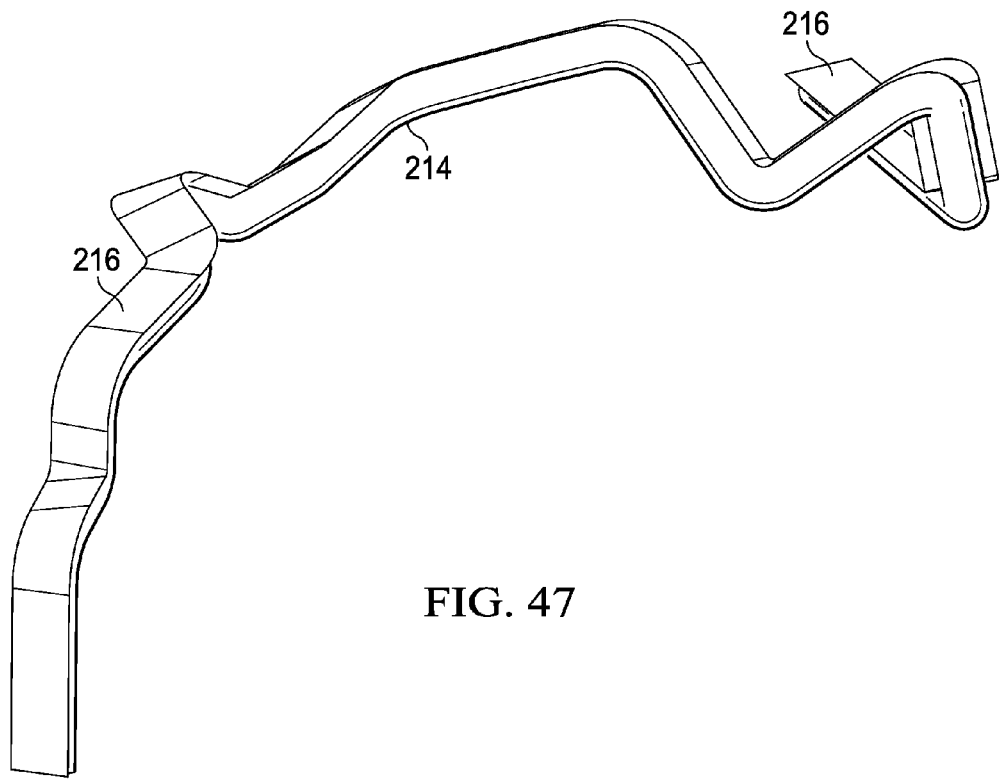

FIGS. 45-58 graphically illustrate the steps of a process of mathematically determining the shape and location of features of the gauge 116 shown in FIG. 44, and forms part of the method previously described in connection with FIG. 43. Referring to FIG. 45, 3-D data, such as a CAD file is produced or provided which defines the size and shape of the tube 126. Next, as shown in FIG. 46, a tolerance boundary 214 is offset around the shape of the tube 126. The tolerance boundary 214 represents the outer tolerance within which the tube 126 must conform. In FIG. 47, a plane 216 created along the top of the tube 126 that is oriented at an angle that is best suited for the start angle of the sweep of the tube 126. In the illustrated example, the plane 216 is tangent along the top of the tolerance boundary 214.

Figure 48:
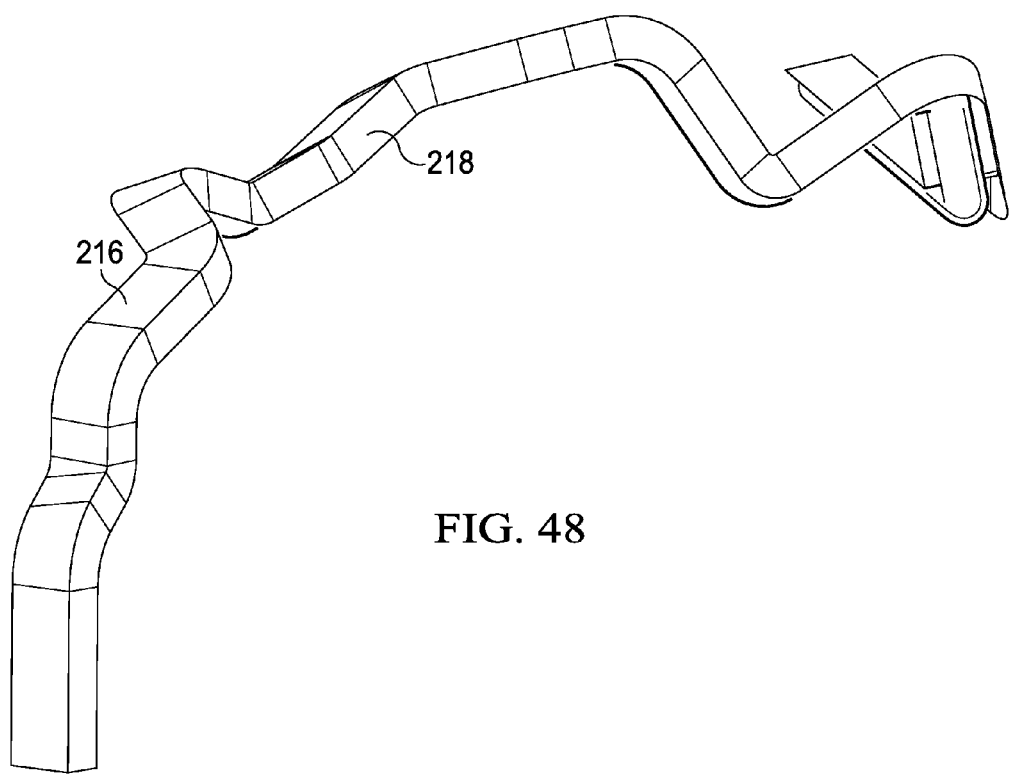
Figure 49:
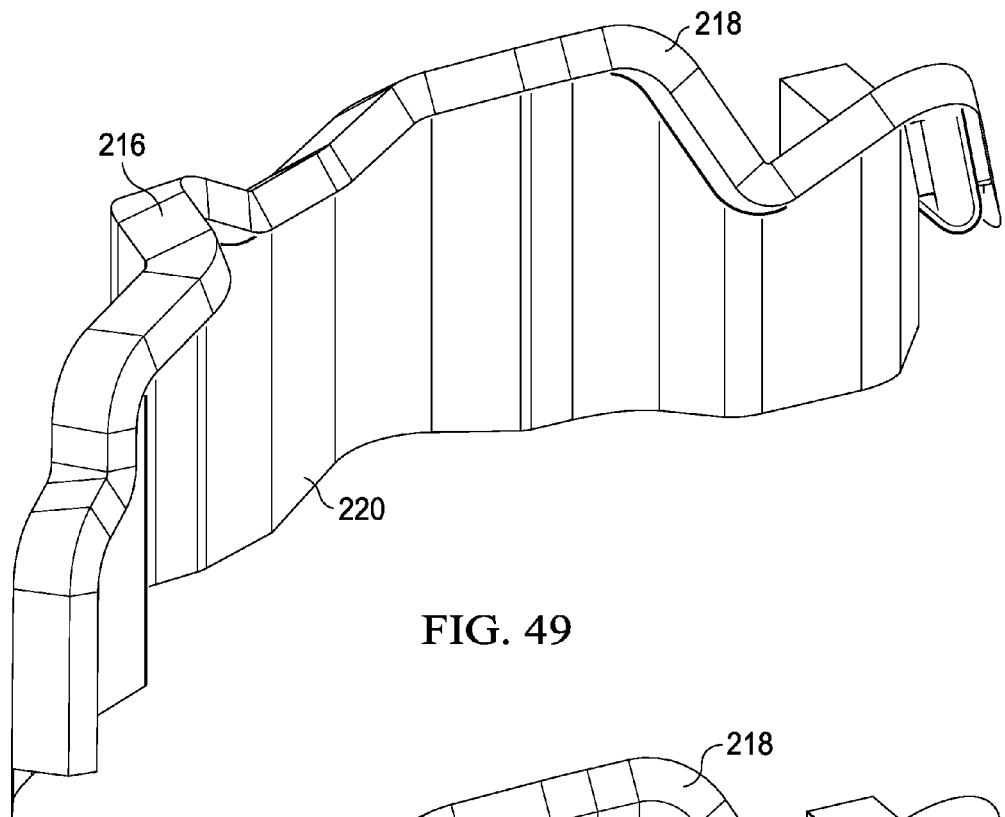
Figure 50:
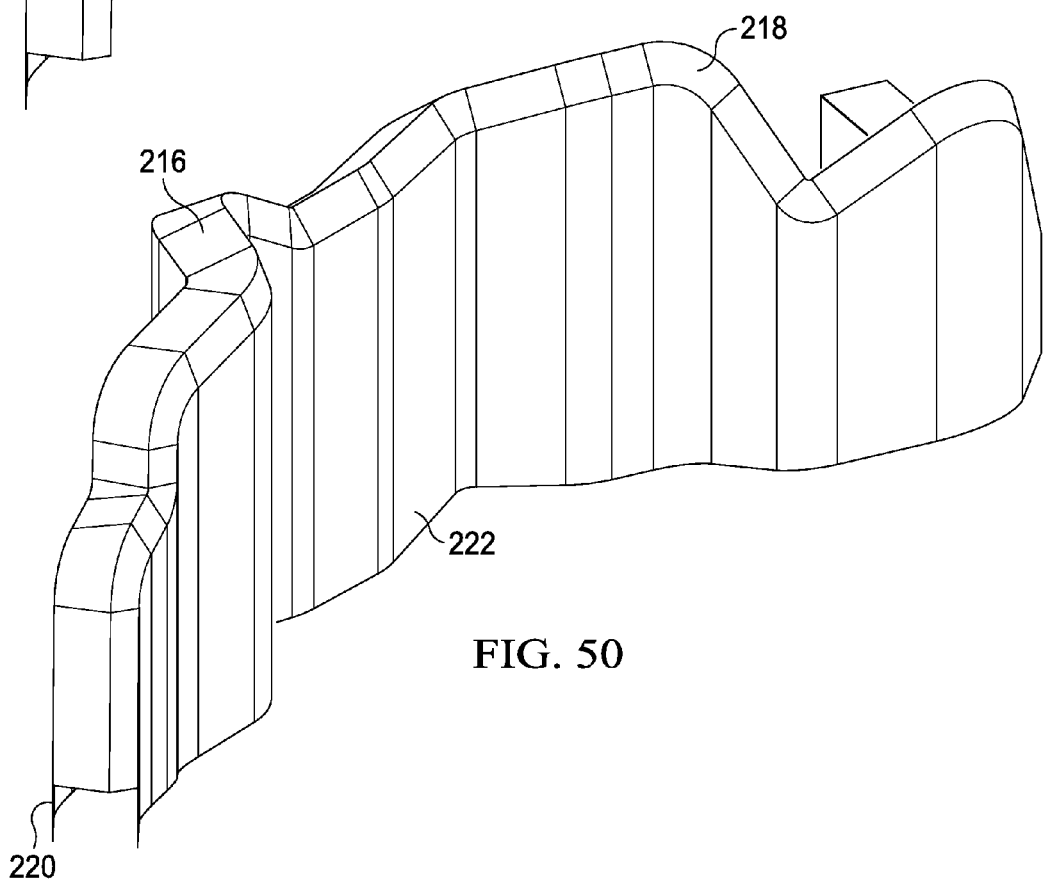
Figure 51:
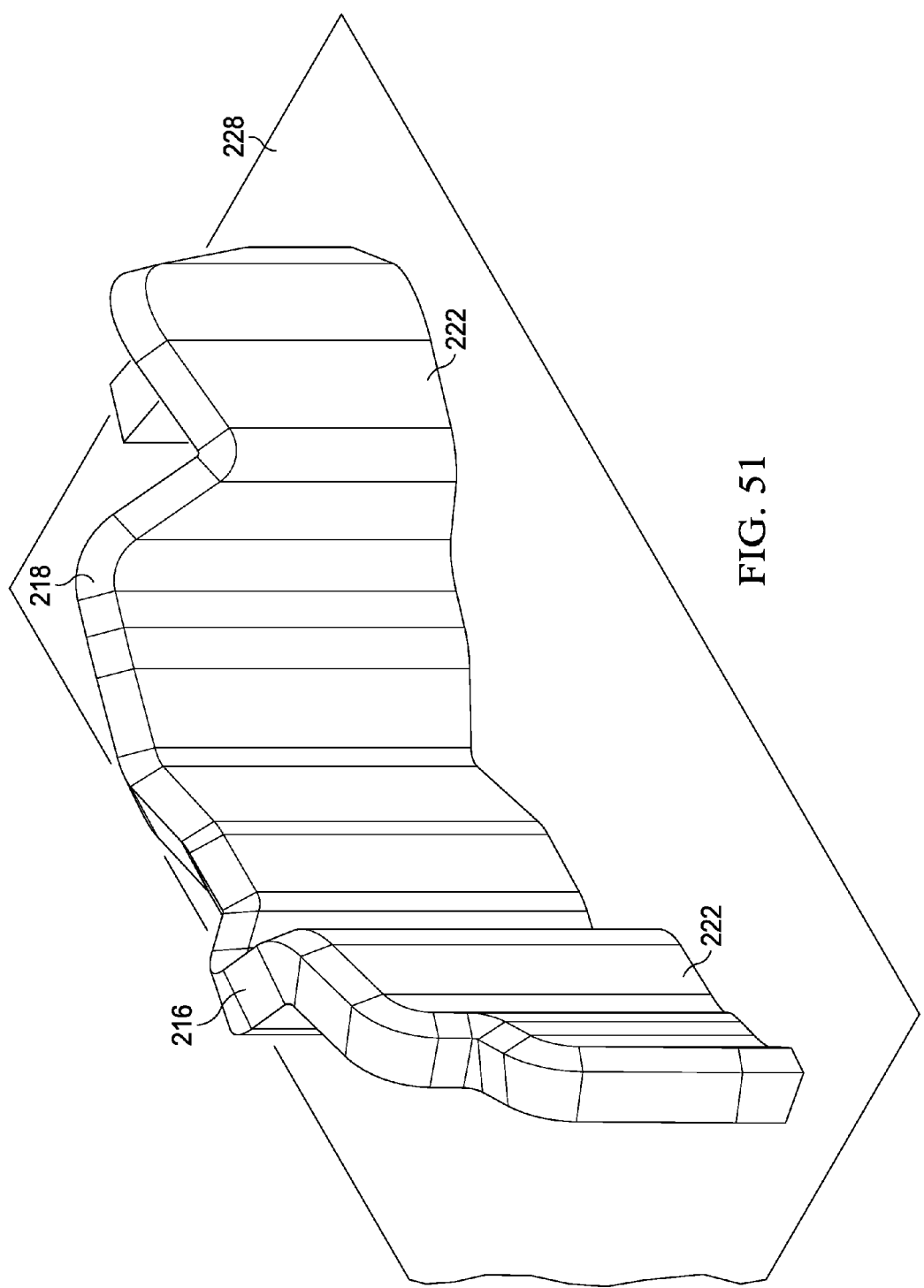
Figure 52:
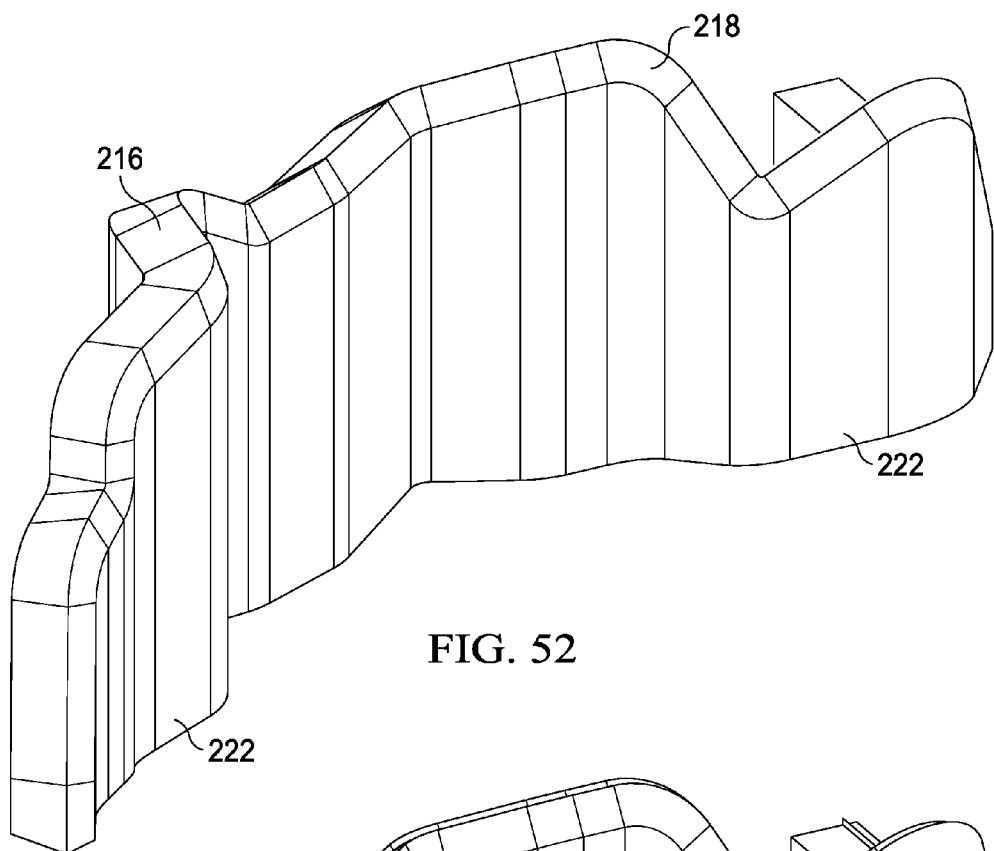
Figure 53:
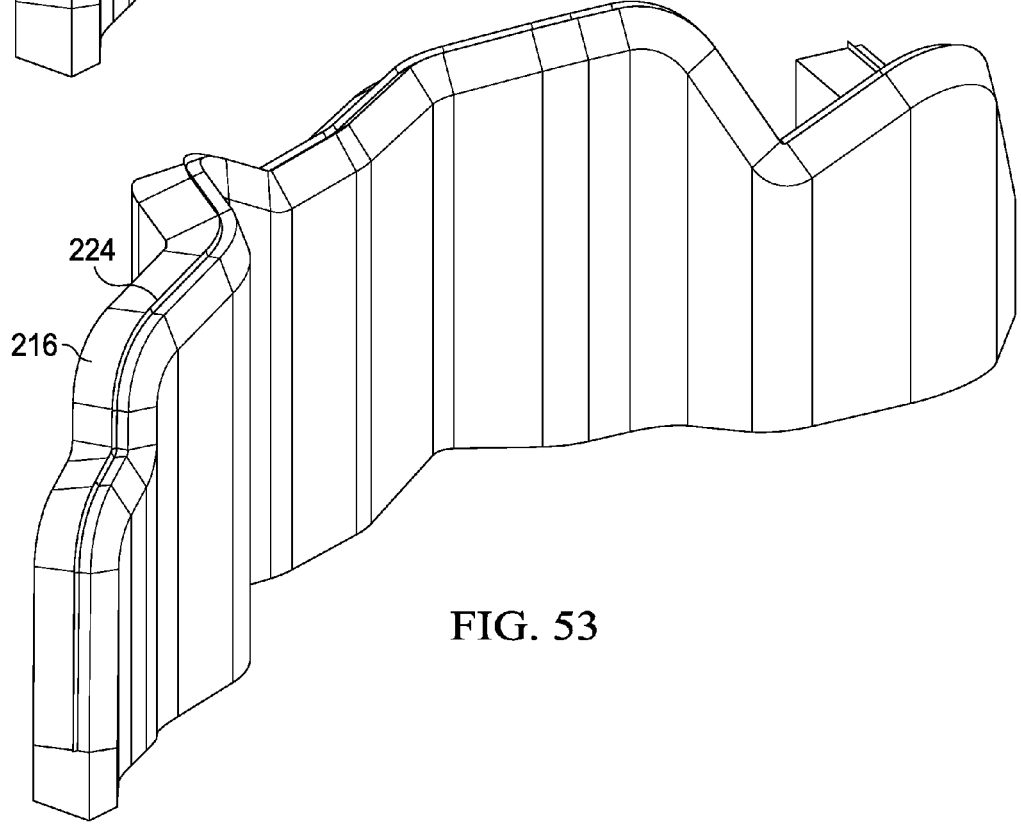

In FIG. 48, another plane 218 is generated along the sweep of the tube 126, which is essentially perpendicular to, and intersects plane 216. The plane 218 extends sufficiently below the tolerance boundary 214 to allow another plane to be generated which extends downwardly to the base 118. In FIG. 49, a plane 220 is generated which extends from one of the planes 218 downwardly to the base 118 (not shown in FIG. 49). Similarly, as shown in FIG. 50, an additional plane 222 is projected down from one of the planes 218, perpendicular to the base 118. Planes 220, 222, are closed at their ends in order to define the lateral surface boundaries of the tube channel segment blocks 122. Referring to FIG. 51, a flat surface 228 is generated along the bottom planes 220, 222 to create an enclosed volume, shown in FIG. 52 corresponding to the combined shape of the tube channel segment blocks 122.

Figure 54:
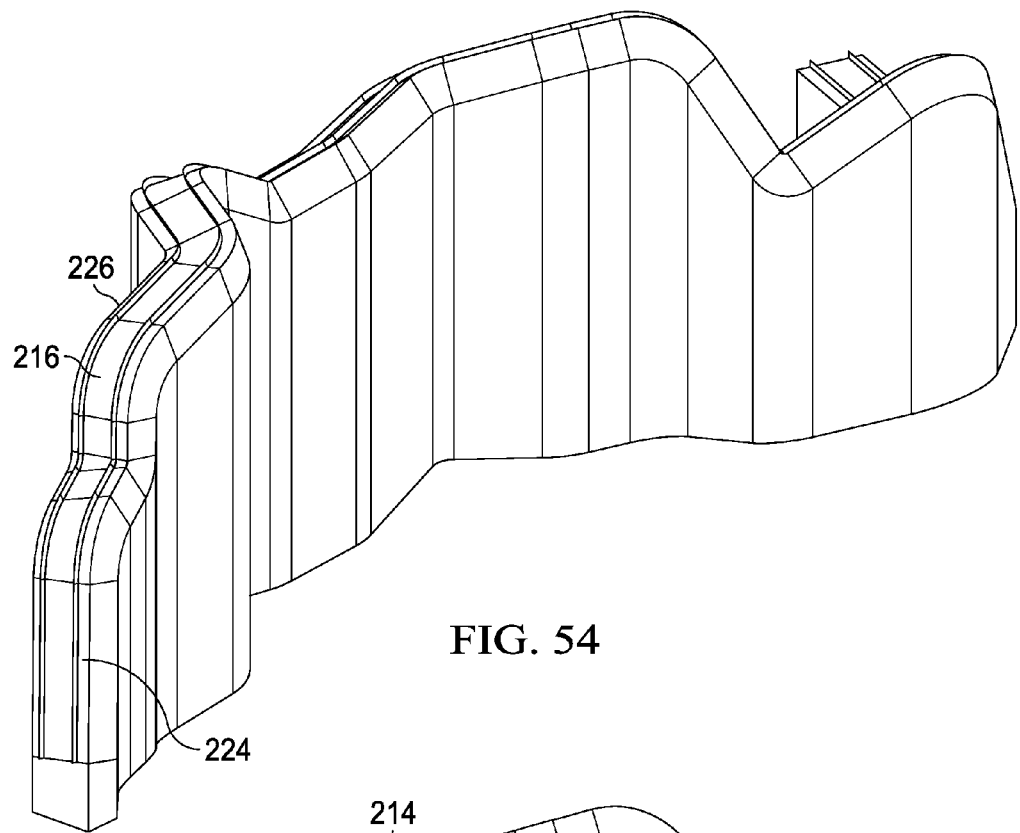
Figure 55:
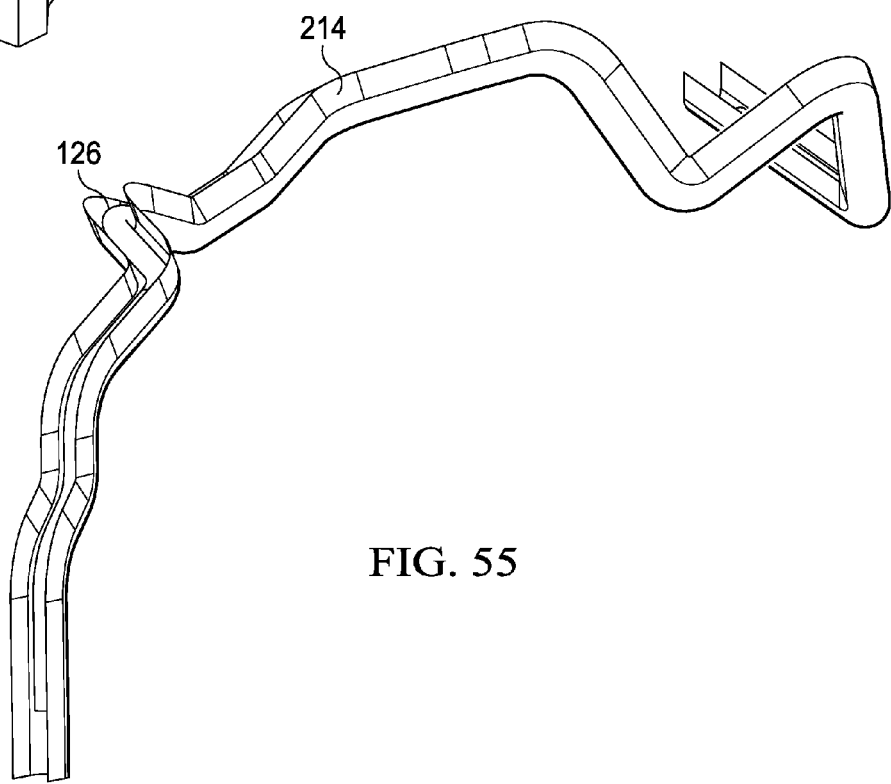
Figure 56:
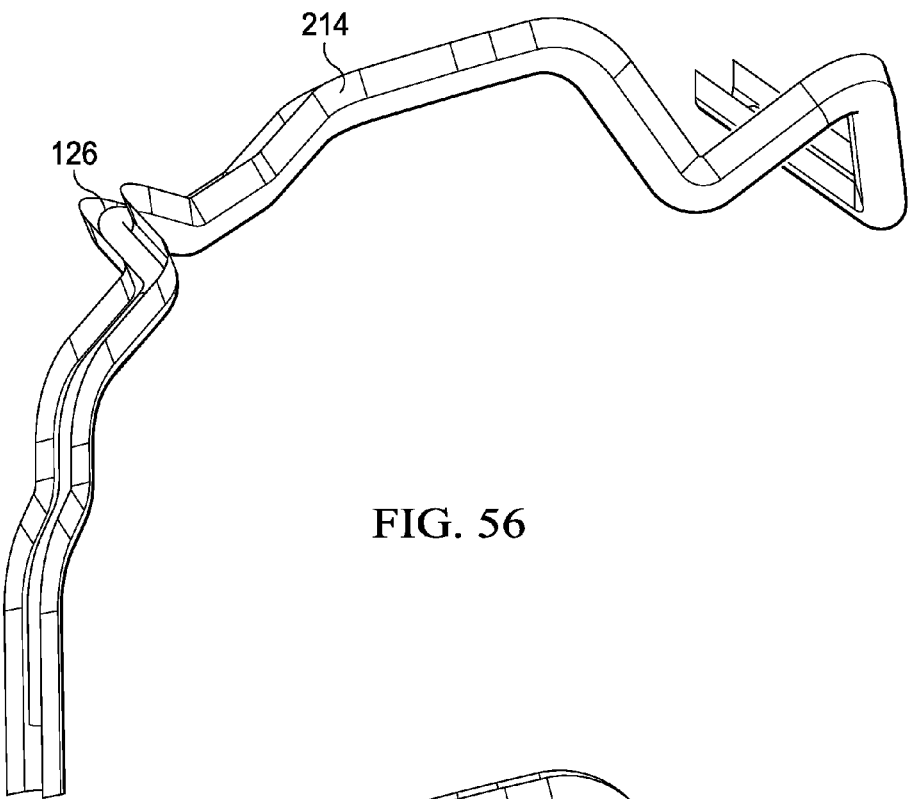
Figure 57:
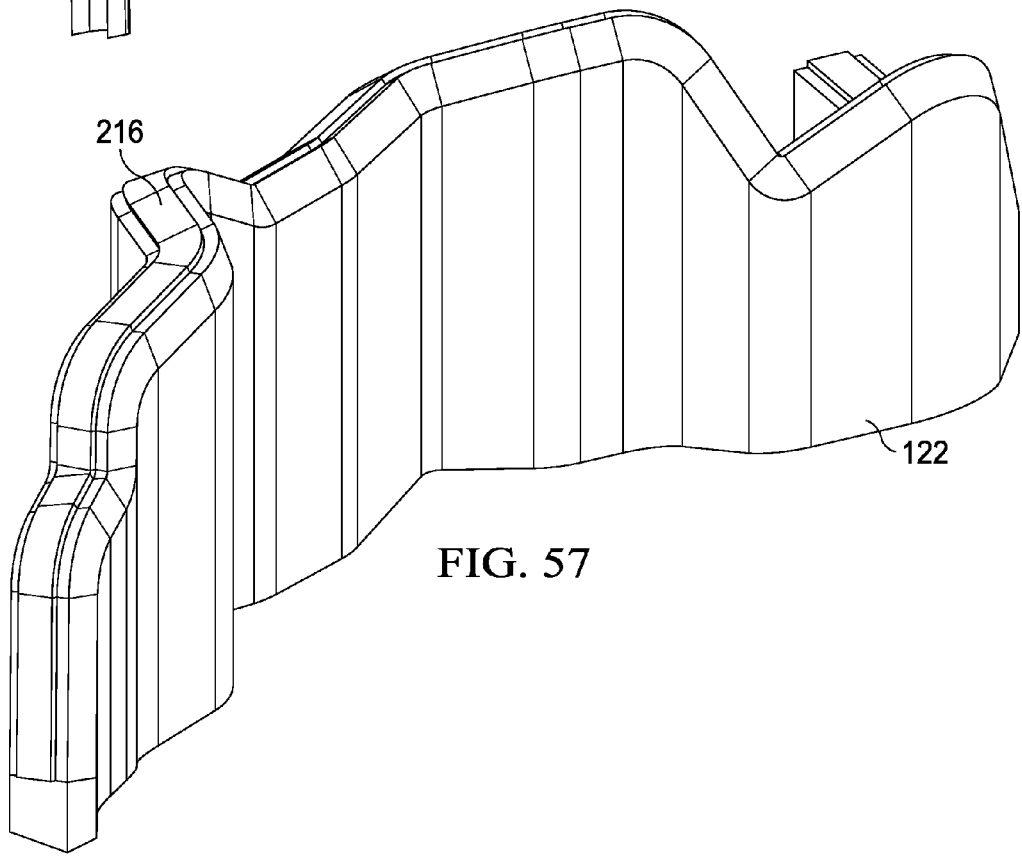
Figure 58:
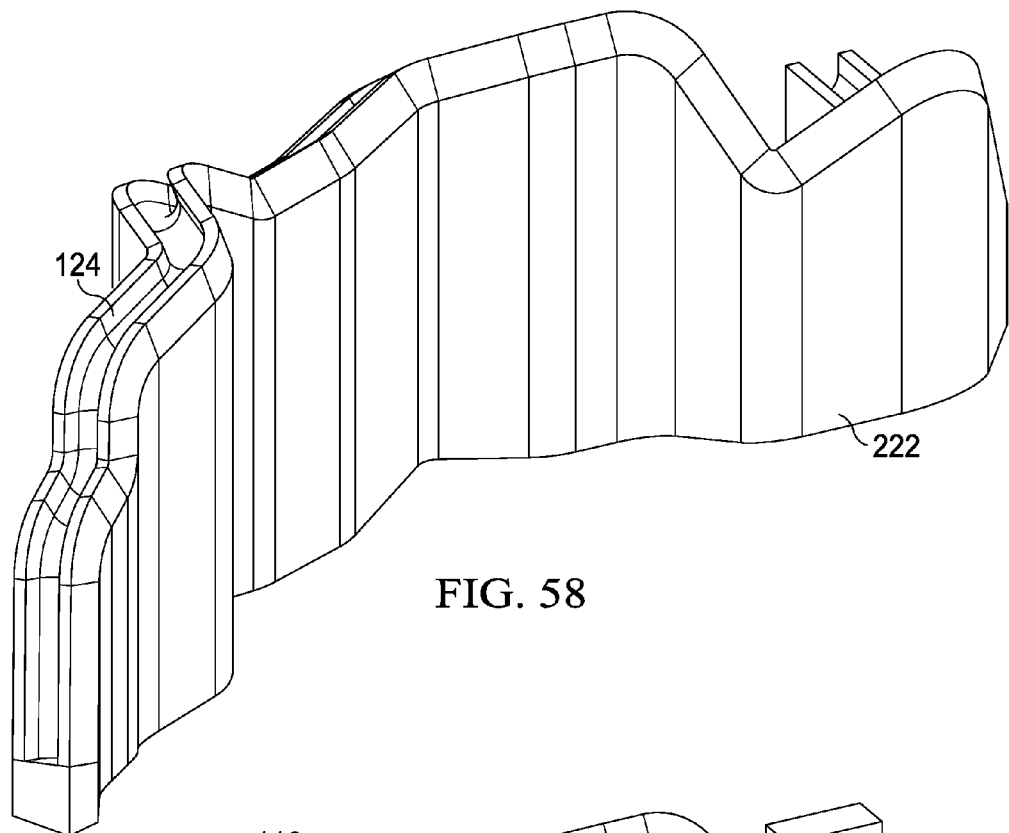
Figure 59:
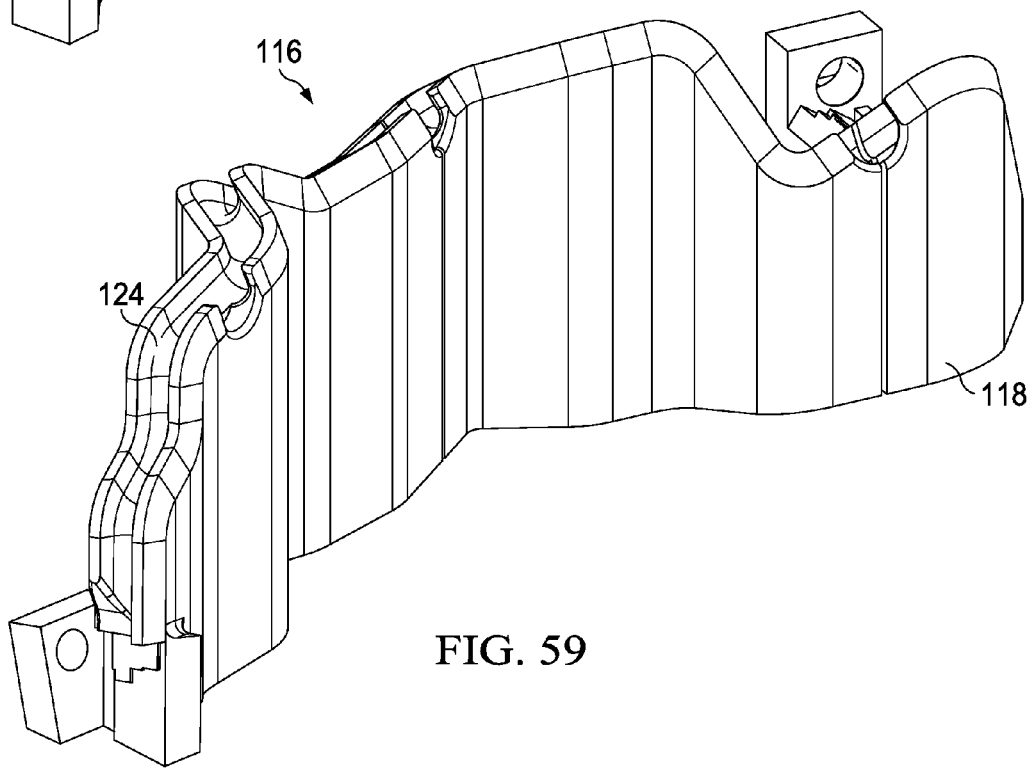

Referring now to FIG. 3, next, a first line 224 is generated along plane 216 which corresponds to one side of the tolerance tube channel 124, along the upper surface 128. Then, as shown in FIG. 54, a second line 226 is also formed along plane 216 defining the other side of the tolerance tube channel 124. FIG. 55 is a view similar to FIG. 54, but the gauge blocks having been removed for clarity, and a portion of the tube tolerance channel 124 having been broken away to show the tube 126 positioned in the tube tolerance channel 124 defined by lines 224, 226. In FIG. 56, the top of the boundary is closed off, creating a profile representing the entire cross-sectional area of the tube tolerance channel 124 which is required to be removed from the gauge blocks 122. FIG. 57 is similar to FIG. 56 which shows the gauge blocks 122 having been added. Next, as shown in FIG. 58, the tube tolerance channel 124 is removed from the solid gauge blocks 122, leaving the tube tolerance channel 124. FIG. 59 shows the final gauge 116 produced by the process described above in connection with FIGS. 45-58, without the tube 126.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different advantages as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method of making a gauge for checking a tolerance of a manufactured tube having at least one bend therein, comprising:
   using an additive manufacturing machine to form at least a first gauge block layer-by-layer, including forming a radiused tube channel having a predefined tolerance boundary, wherein the gauge block has features that are integrated within a common reference coordinate system; and
   using a computer numerically controlled system to control the operation of the additive manufacturing machine based on a 3-D digital model of the gauge.

2. A method of making a gauge for checking a tolerance of a manufactured tube having at least one bend therein, comprising:
   using an additive manufacturing machine to form at least a first gauge block layer-by-layer, including forming a visible tolerance marker on the gauge block to indicate whether an end of a tube is within a length tolerance, wherein the gauge block has features that are integrated within a common reference coordinate system; and
   using a computer numerically controlled system to control the operation of the additive manufacturing machine based on a 3-D digital model of the gauge.

3. A method of making a gauge for checking a tolerance of a manufactured tube having at least one bend therein, comprising:
   using an additive manufacturing machine to form at least a first gauge block layer-by-layer, including forming a radiused tube channel adapted to receive a tube therein and having sidewalls configured to provide tolerance boundaries, and forming cutouts in the sidewalls of the tube channel which allow a tube in the tube channel to be grasped, wherein the gauge block has features that are integrated within a common reference coordinate system; and
   using a computer numerically controlled system to control the operation of the additive manufacturing machine based on a 3-D digital model of the gauge.

4. A method of making a gauge used to check features of a bent tube, comprising:
   obtaining a digital file representing a 3-D model of the tube;
   using a computer to generate a mathematical model of a gauge based on the 3-D model of the tube; and
   building at least one gauge block layer-by-layer, including forming a tube channel adapted to receive the tube therein and having a tolerance boundary allowing the tolerance of the tube to be checked.

5. The method of claim 4, wherein building the gauge block is performed using additive manufacturing.

6. The method of claim 5, wherein the additive manufacturing is performed using a fused deposition modeling machine.

7. The method of claim 4, wherein generating the mathematical model of the gauge includes modeling multiple gauge features that are integrated within a common reference coordinate system.

8. The method of claim 4, wherein generating a mathematical of the gauge includes generating offset surfaces of the boundary of the tube along a profile of the tube.

9. The method of claim 8, wherein generating the offset surfaces is performed using contour tolerance values for an envelope of the tube.

10. The method of claim 4, wherein generating the mathematical model of the gauge includes selecting surfaces of the 3-D model of the tube and offsetting the selected surfaces using an automated program to generate offset math data representing offsets.

\* \* \* \* \*